(12) United States Patent
Naruse

(10) Patent No.: US 11,324,131 B2
(45) Date of Patent: May 3, 2022

(54) CIRCUIT BOARD, DESIGNING METHOD OF CIRCUIT BOARD, AND SEMICONDUCTOR DEVICE

(71) Applicant: AISIN CORPORATION, Kariya (JP)

(72) Inventor: Takanobu Naruse, Nishio (JP)

(73) Assignee: AISIN CORPORATION, Kariya (JP)

( * ) Notice: Subject to any disclaimer, the term of this patent is extended or adjusted under 35 U.S.C. 154(b) by 49 days.

(21) Appl. No.: 16/640,492

(22) PCT Filed: Sep. 21, 2018

(86) PCT No.: PCT/JP2018/035026
§ 371 (c)(1),
(2) Date: Feb. 20, 2020

(87) PCT Pub. No.: WO2019/065494
PCT Pub. Date: Apr. 4, 2019

(65) Prior Publication Data
US 2020/0187370 A1      Jun. 11, 2020

(30) Foreign Application Priority Data

Sep. 29, 2017   (JP) .............................. JP2017-191843

(51) Int. Cl.
*H05K 5/00*      (2006.01)
*H01L 23/12*     (2006.01)

(52) U.S. Cl.
CPC ........... *H05K 5/0069* (2013.01); *H01L 23/12* (2013.01)

(58) Field of Classification Search
CPC ... H05K 5/00; H05K 1/11; H05K 1/14; H05K 1/18; H01L 23/48–58; H01L 2204/16225; H01L 2204/32145; H01L 2204/32225
(Continued)

(56) References Cited

U.S. PATENT DOCUMENTS 4,628,343 A    12/1986 Komatsu
5,703,402 A *  12/1997 Chu ................. H01L 23/49816
                                                257/700

(Continued)

FOREIGN PATENT DOCUMENTS

EP    2 808 890 A1    12/2014
EP    2 840 606 A2    2/2015
(Continued)

OTHER PUBLICATIONS

Oct. 29, 2020 Supplementary Search Report issued in European Patent Application No. 18 86 3323.
(Continued)

*Primary Examiner* — Tuan T Dinh
(74) *Attorney, Agent, or Firm* — Oliff PLC

(57) ABSTRACT

A circuit board is installed with a semiconductor module on an upper face and provided with connection terminals on a lower face. A connection pin is provided on at least some of the connection terminals. The connection terminals include a drive terminal for driving the semiconductor module and a function terminal for connecting the semiconductor module and other function units. The disposition of the drive terminal in each of divided areas is point-symmetric with respect to a center of the circuit board. The divided areas divide the circuit board into fourths.

13 Claims, 10 Drawing Sheets

(58) Field of Classification Search
USPC ......... 361/767–790, 803; 257/693, 736–738, 257/777–786
See application file for complete search history.

(56) References Cited

U.S. PATENT DOCUMENTS

| | | | | |
|---|---|---|---|---|
| 6,037,677 | A * | 3/2000 | Gottschall | H01L 23/49838 307/43 |
| 6,225,702 | B1 * | 5/2001 | Nakamura | H01L 23/50 257/786 |
| 6,265,783 | B1 * | 7/2001 | Juso | H01L 23/3128 257/738 |
| 6,667,561 | B2 * | 12/2003 | Baker | H05K 1/029 257/786 |
| 6,762,495 | B1 * | 7/2004 | Reyes | H01L 23/3128 257/737 |
| 7,151,319 | B2 * | 12/2006 | Iida | H01L 23/49827 257/786 |
| 7,391,122 | B1 * | 6/2008 | Hool | B65D 21/041 257/786 |
| 7,687,803 | B2 * | 3/2010 | Takagi | G01R 1/0491 257/48 |
| 8,076,787 | B2 * | 12/2011 | Hayashi | H01L 24/17 257/786 |
| 8,946,892 | B2 * | 2/2015 | Kim | H01L 23/50 257/738 |
| 2004/0164385 | A1 | 8/2004 | Kado et al. | |
| 2006/0189031 | A1 | 8/2006 | Kado et al. | |
| 2009/0189268 | A1 | 7/2009 | Kado et al. | |
| 2010/0015760 | A1 | 1/2010 | Kado et al. | |
| 2010/0264950 | A1 | 10/2010 | Kaku | |
| 2011/0171780 | A1 | 7/2011 | Kado et al. | |
| 2012/0182699 | A1 * | 7/2012 | Zhang | H01L 23/5385 361/742 |
| 2012/0264240 | A1 | 10/2012 | Kado et al. | |
| 2013/0175684 | A1 * | 7/2013 | Rhyner | H01L 23/49816 257/738 |
| 2013/0320571 | A1 | 12/2013 | Kado et al. | |
| 2014/0117541 | A1 | 5/2014 | Kado et al. | |
| 2014/0159237 | A1 * | 6/2014 | Kwon | H01L 24/06 257/738 |
| 2015/0054155 | A1 | 2/2015 | Ohara | |
| 2015/0108639 | A1 | 4/2015 | Kado et al. | |
| 2015/0124419 | A1 * | 5/2015 | Wong | H05K 1/111 361/767 |
| 2015/0137363 | A1 | 5/2015 | Ozawa et al. | |

FOREIGN PATENT DOCUMENTS

JP      2015-41647 A      3/2015
WO      2002/103793 A1    12/2002

OTHER PUBLICATIONS

Dec. 4, 2018 International Search Report issued in International Patent Application No. PCT/JP2018/035026.

* cited by examiner

CIRCUIT BOARD, DESIGNING METHOD OF CIRCUIT BOARD, AND SEMICONDUCTOR DEVICE

TECHNICAL FIELD

Related technical fields include circuit boards, designing methods of circuit boards, and semiconductor devices.

BACKGROUND

A circuit board that is formed to have a rectangular shape when viewed in plan, that is installed with a semiconductor module on an upper face, and that is provided with a plurality of connection terminals on a lower face is used. An example of a circuit board with such a configuration is disclosed in WO 02/103793. A chip including a plurality of semiconductor elements is installed on an upper face of a circuit board (multi-chip module; MCM) according to WO 02/103793 and a plurality of functions can be attained with one circuit board. A connection pin with a ball shape is connected to each of the connection terminals.

SUMMARY

With such a circuit board, the connection terminals provided on the lower face of the circuit board and the connection pins that are connected to the connection terminals are often collectively disposed based on a function. In this case, when there is an unnecessary function, not providing a connection pin for an unused connection terminal corresponding to the unnecessary function is conceivable. However, in such a case, there is a possibility that the circuit board will be tilted depending on whether the connection pin is provided, when the circuit board is connected to another circuit board by reflow soldering and the like.

It is desired that a circuit board be realized, in which the circuit board is less likely to be tilted when the circuit board is connected to another circuit board even when there is an unused terminal in a part of the circuit board.

A circuit board according to the disclosure is a circuit board that is formed to have a rectangular shape when viewed in plan, that is installed with a semiconductor module on an upper face, and that is provided with a plurality of connection terminals on a lower face, in which a connection pin protruding from the lower face is provided on at least some connection terminals. The connection terminals include a drive terminal for driving the semiconductor module and a function terminal for connecting the semiconductor module and other function units. The disposition of the drive terminal in each of divided areas is point-symmetric with respect to the center of the lower face, the divided areas being the lower face divided into four with two virtual lines that pass through the middle of each side of the lower face and that intersect at the center of the lower face.

A designing method of a circuit board according to the disclosure is a designing method of a circuit board that is formed to have a rectangular shape when viewed in plan, that is installed with a semiconductor module on an upper face, that is provided with a plurality of connection terminals on a lower face, and that is provided with a connection pin protruding from the lower face on at least some connection terminals. The designing method includes: sorting the connection terminals into a drive terminal for driving the semiconductor module and a function terminal for connecting the semiconductor module and other function units; and disposing the drive terminal and the function terminal so that the disposition of the drive terminal in each of divided areas is point-symmetric with respect to the center of the lower face, the divided areas being the lower face divided into four with two virtual lines that pass through the middle of each side of the lower face and that intersect at the center of the lower face.

With such a configuration, the circuit board is less likely to be tilted when the circuit board is connected to another circuit board such as a system circuit board, even if the connection pin is not provided on some function terminals, since the disposition of the drive terminals in each of the four divided areas is point-symmetric with respect to the center of the lower face. It is thus possible to realize the circuit board that is less likely to be tilted when the circuit board is connected to another circuit board even when there is an unused terminal in a part of the circuit board.

Another circuit board according to the disclosure is a circuit board that is formed to have a rectangular shape when viewed in plan, that is installed with a semiconductor module on an upper face, and that is provided with a plurality of connection terminals on a lower face, in which the connection terminals include a pin terminal that is provided with a connection pin that protrudes from the lower face and a pin-less terminal that is not provided with the connection pin. The connection terminal adjacent to the pin-less terminal is the pin terminal, and the pin terminal is disposed at a position closest to a corner of the lower face.

With such a configuration, the entire circuit board is generally uniformly supported by the connection pins, since the pin-less terminals are disposed so as to be dispersed without being adjacent to each other and grouping together and the pin-less terminals are at least disposed at four points that are located at the outermost positions of the rectangular circuit board. The circuit board is thus less likely to be tilted when the circuit board is connected to another circuit board such as a system circuit board, even when some of the connection terminals are pin-less terminals. It is thus possible to realize the circuit board that is less likely to be tilted when the circuit board is connected to another circuit board. It is also possible to suppress the circuit board from being warped when the circuit board is heated.

A semiconductor device according to the disclosure includes:

a circuit board that is formed to have a rectangular shape when viewed in plan, that is installed with a semiconductor module on an upper face, and that is provided with a plurality of connection terminals on a lower face; and a main circuit board on which the circuit board is surface-mounted via the connection terminals. A power source unit, a clock unit, and a reset unit are disposed on the main circuit board. Circuit board terminals that are each connected to a corresponding one of an audio function unit and a camera function unit are provided on the main circuit board. A connection pin protruding from the lower face is provided on at least some connection terminals. The connection terminals include a drive terminal for connecting the semiconductor module with the power source unit, the clock unit, and the reset unit, and a function terminal for connecting the semiconductor module and the circuit board terminals. In the circuit board, the disposition of the drive terminal in each of divided areas is point-symmetric with respect to the center of the lower face, the divided areas being the lower face divided into four with two virtual lines that pass through the middle of each side of the lower face and that intersect at the center of the lower face.

With such a configuration, the circuit board is less likely to be tilted when the circuit board and the main circuit board are connected, even when the connection pin is not provided for the function terminal corresponding to the unnecessary function unit if either the audio function unit or the camera function unit is unnecessary, since the disposition of the drive terminals in each of the four divided areas is point-symmetric with respect to the center of the lower face. It is thus possible to keep the generation rate of a defective product low and decrease manufacturing costs, and increase reliability of the semiconductor device.

Further features and advantages of the technique according to the disclosure will become apparent from the following descriptions of the embodiments which are exemplary and non-limiting and which are given with reference to the accompanying drawings.

DETAILED DESCRIPTION OF EXEMPLARY EMBODIMENTS

Figure 1:
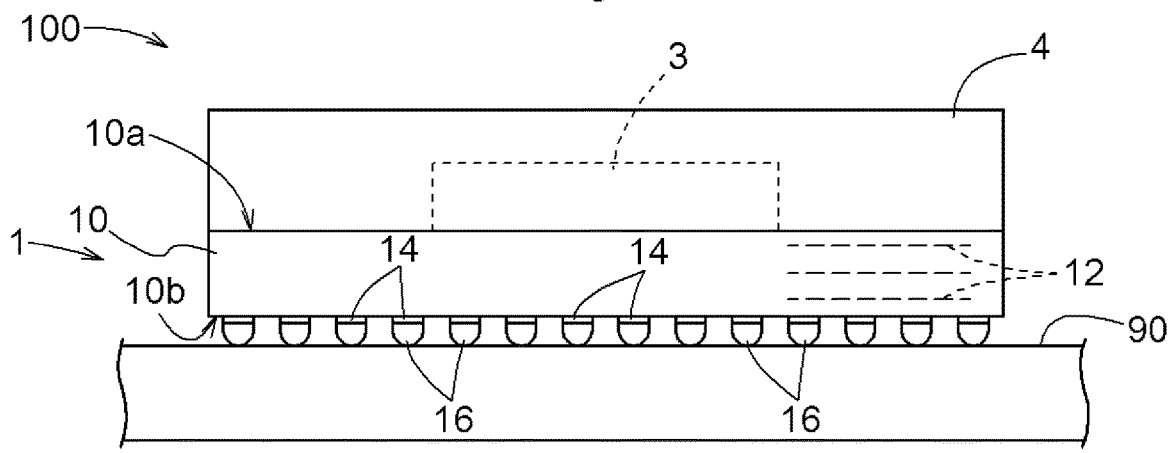
FIG. 1 is a side view of a semiconductor device according to an embodiment.

Embodiments of a circuit board and a designing method of the circuit board will be described with reference to the drawings. As illustrated in FIG. 1, a circuit board 1 according to the embodiment is used being placed in a semiconductor device 100. The semiconductor device 100 has the circuit board 1, a semiconductor module 3, and a molded portion 4. The semiconductor device 100 is connected to a system circuit board 90 that is an example of another circuit board. The semiconductor device 100 is used as a core that drives a multimedia system in which an audio device, a navigation device, and the like are integrated, the multimedia system being installed in a vehicle such as an automobile, for example. In the system, the semiconductor device 100 according to the embodiment is commonly used to attain a plurality of functions such as an audio function, a navigation function, and a camera function.

The semiconductor module 3 may be a semiconductor chip configured of a single semiconductor element, or may be a multi-chip module (MCM) configured of a plurality of semiconductor elements. In view of reducing the size and increasing the performance etc., the latter configuration is preferable. In the case of the latter configuration, a memory in which an operation program is stored (read only memory; ROM), a memory in which an operation area is set (random access memory; RAM), and the like may be included as one of the semiconductor elements that configure the semiconductor module 3.

The semiconductor module 3 is mounted on an upper face 10a of a circuit board body 10 that configures the circuit board 1. The semiconductor module 3 is disposed in a middle portion of the circuit board 1 when viewed in plan. The term "when viewed in plan" is a state viewed along a direction orthogonal to a flat plate that configures the circuit board 1. The semiconductor module 3 is electrically connected to a connection terminal provided on the upper face 10a of the circuit board body 10, by a bonding wire, for example. The semiconductor module 3 is embedded in the molded portion 4 made of resin material, for example.

Figure 2:
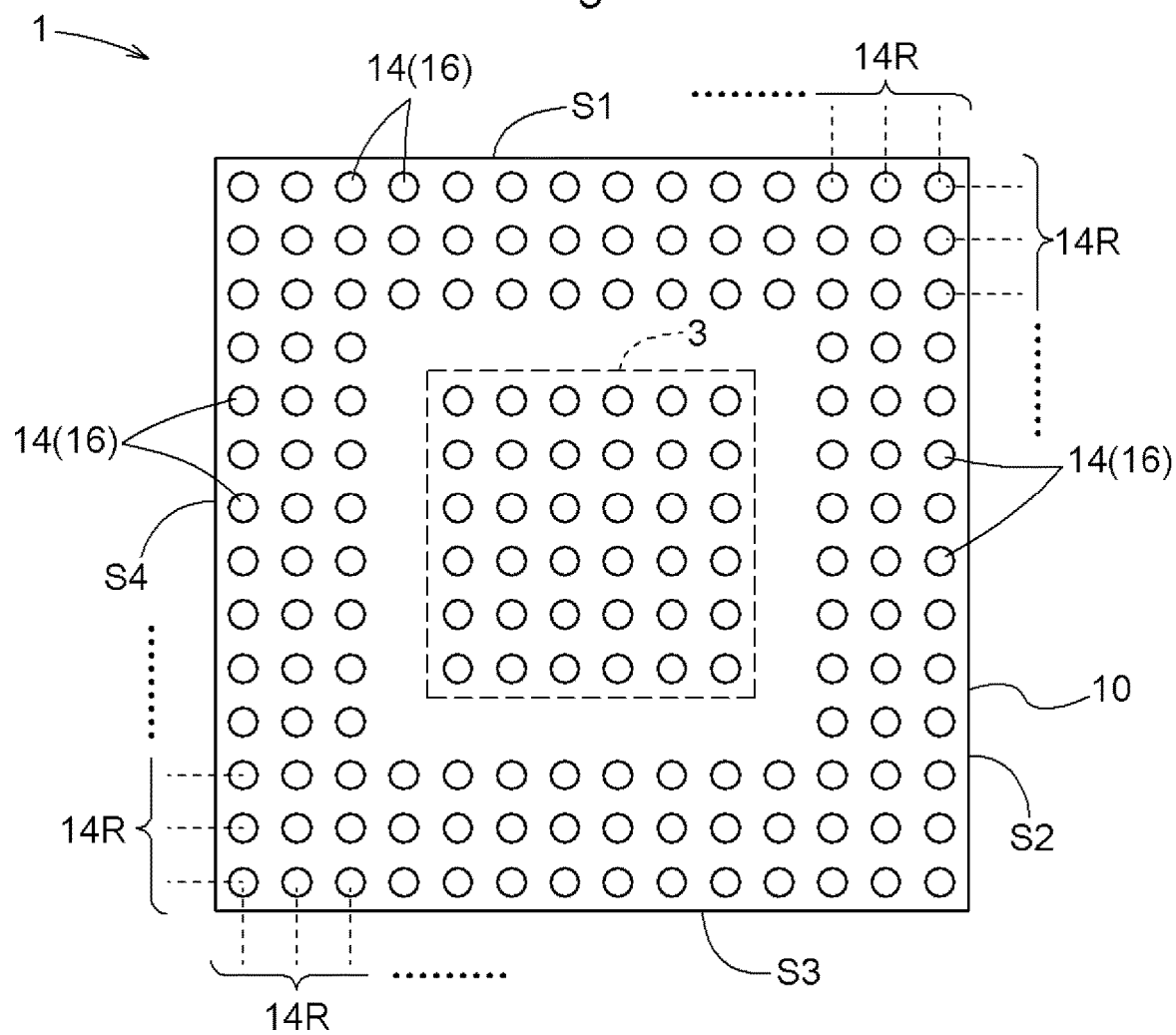
FIG. 2 is a bottom view of the semiconductor device.

As illustrated in FIG. 2 that is a view from a lower face 10b side, the circuit board 1 in which the semiconductor module 3 is installed on the upper face 10a is formed to have a rectangular shape when viewed in plan. In the illustrated example, the circuit board 1 is formed to have a square shape when viewed in plan. However, the configuration is not limited to this, and the circuit board 1 may be configured to have an oblong rectangular shape when viewed in plan. In the circuit board body 10, the circuit board 1 has a plurality of wiring layers 12 that are stacked so as to form a plurality of layers. That is, the circuit board 1 of the embodiment is a multi-layer wiring-type circuit board.

A plurality of connection terminals 14 are provided on the lower face 10b of the circuit board body 10. The connection terminals 14 are disposed along each side (a first side S1, a second side S2, a third side S3, and a fourth side S4) of the circuit board body 10 so as to form a plurality of terminal arrays 14R from an outer edge of the circuit board body 10. In the embodiment, a total of 168 connection terminals 14 are disposed in an orthogonal lattice shape overall, with the exception of an area in the center portion in which the connection terminal 14 is not disposed, so that three terminal arrays 14R are formed from an outer edge of each side S1 to S4, and so that three terminal arrays 14R are formed on an inner side of the three terminal arrays 14R that are formed from the outer edge of each side S1 to S4 after skipping a line. In the embodiment, the area in which the connection terminal 14 is not disposed is provided so that it is easier to dispose a capacitor. However, the configuration may be a full-grid configuration that is not provided with the area in which the connection terminal 14 is not disposed. As illustrated in FIG. 1, a connection pin 16 is provided on each connection terminal 14 so that the connection pin 16 protrudes from the lower face 10b of the circuit board body 10.

The shape of the connection pin 16 is not particularly limited as long as the connection pin 16 protrudes from the lower face 10b of the circuit board body 10. The connection pin 16 may be formed in a ball shape, a cylindrical shape, or a prism shape, for example. The connection pin 16 is a contact point on the semiconductor device 100 side when the system circuit board 90 that is an example of another circuit board and the semiconductor device 100 are electrically connected. The system circuit board 90 and the semiconductor device 100 can be connected by reflow soldering, for example. That is, the system circuit board 90 and the semiconductor device 100 can be connected by applying or printing a cream solder to the contact point on the system circuit board 90 side, mounting thereon the semiconductor device 100 having a plurality of the connection pins 16, and then heating the entirety to melt the solder.

As described above, although the semiconductor device 100 can attain a plurality of functions, there are functions that work extensively to attain each function and that are always used, and there are functions that are not used depending on the configuration of the system (unnecessary functions). When there is an unnecessary function, it is preferable that the connection pin 16 be not provided on the connection terminal 14 corresponding to the unnecessary function, from the view point of making it easier to perform an insulation confirmation test (including making it unnecessary to carry out the confirmation test). However, there is a possibility that the semiconductor device 100 will be tilted during reflow soldering due to the connection pins 16 not being provided on some of the connection terminals 14, since the connection terminals 14 are usually collectively disposed based on the function.

Figure 3:
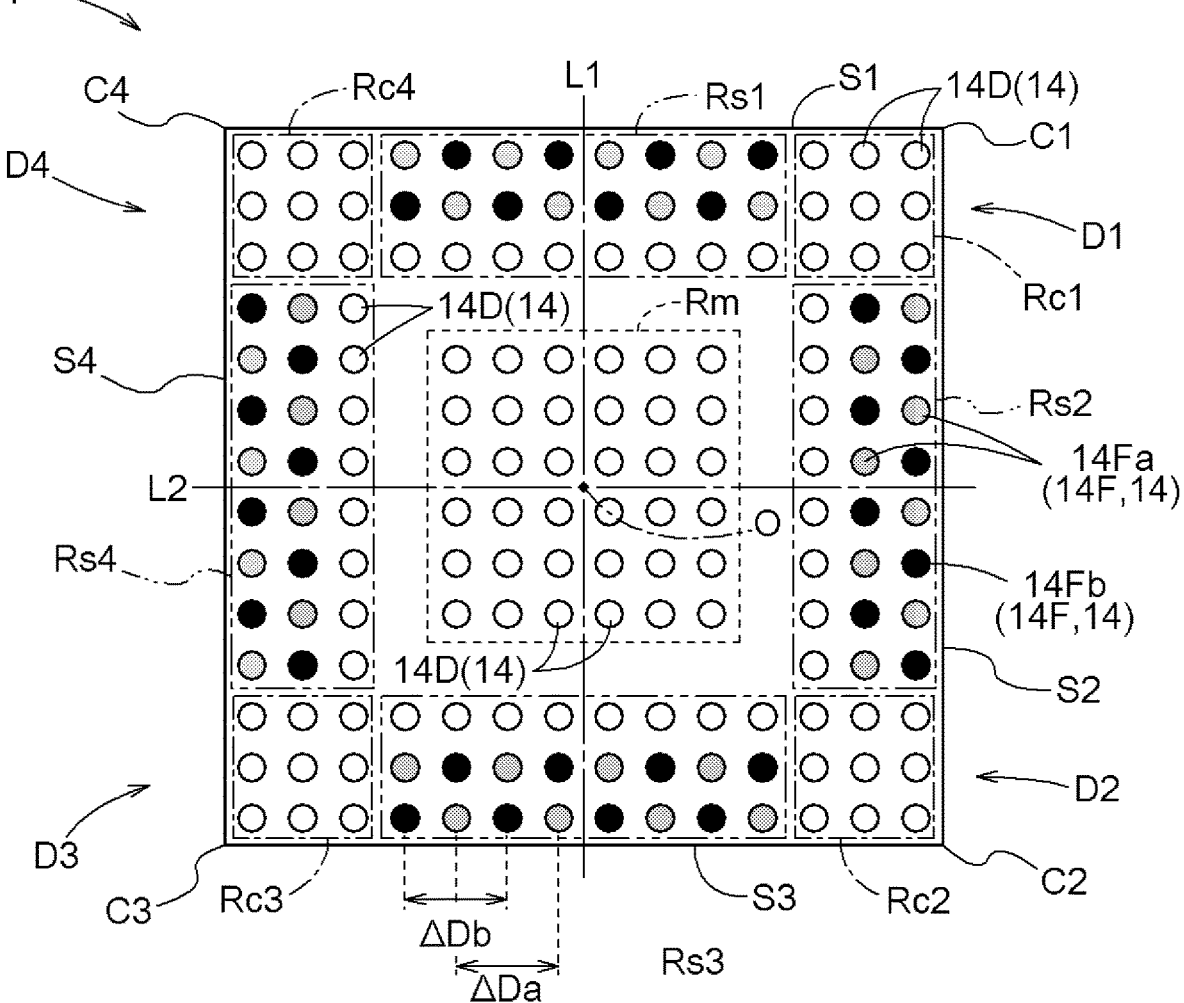
FIG. 3 is an explanatory view of a designing method of the disposition of each connection terminal.

In the embodiment, the circuit board 1 is designed based on the following designing method (hereinafter referred to as "the designing method") (see FIG. 3). In the designing method, the connection terminals 14 are each sorted into a drive terminal 14D or a function terminal 14F. The drive terminal 14D is a terminal for driving the semiconductor module 3. The drive terminal 14D includes a power terminal of the semiconductor module 3, for example. The drive terminal 14D may include a connection terminal with a memory in which an operation program of the semiconductor module 3 is stored (ROM), a memory in which the operation area of the semiconductor module 3 is set (RAM) and the like. The function terminal 14F is a terminal for connecting the semiconductor module 3 with other function units. Such other function units include an audio function unit, a navigation function unit, a camera function unit and the like.

In the designing method, the drive terminals 14D are disposed so that the disposition of the drive terminal 14D in each of divided areas in which the circuit board body 10 is divided into four (a first divided area D1, a second divided area D2, a third divided area D3, and a fourth divided area D4) is point-symmetric with respect to a center O of the circuit board body 10. The divided areas D1 to D4 are four areas of the circuit board body 10 that are divided by a first virtual line L1 that passes through the middle of the first side S1 and the third side S3 and a second virtual line L2 that passes through the middle of the second side S2 and the fourth side S4. The first virtual line L1 and the second virtual line L2 intersect (cross at right angles, in the example) at the center O of the circuit board body 10. The divided areas D1 to D4 are each formed to have a rectangular shape in which the relative ratio is 1:2 with respect to the circuit board body 10. The divided areas D1 to D4 are disposed so that corners butt against each other at the center O of the circuit board body 10.

In such a configuration, the second divided area D2 is adjacent to the first divided area D1 with the second virtual line L2 therebetween, and the third divided area D3 is adjacent to the second divided area D2 with the first virtual line L1 therebetween. The fourth divided area D4 is adjacent to the third divided area D3 with the second virtual line L2 therebetween, and is adjacent to the first divided area D1 with the first virtual line L1 therebetween. In the embodiment, the second virtual line can be regarded as "one of the two virtual lines" and the first virtual line L1 can be regarded as "the other one of the two virtual lines".

When the disposition of the drive terminals 14D in each of the four divided areas D1 to D4 is point-symmetric with respect to the center O, this means that the disposition of the drive terminals 14D is point-symmetric between the first divided area D1 and the third divided area D3 in which the positional relation thereof is such that the first divided area D1 and the third divided area D3 are disposed 180 degrees away from each other with respect to the center O, and that the disposition of the drive terminals 14D is point-symmetric between the second divided area D2 and the fourth divided area D4 in which the positional relations thereof is such that the second divided area D2 and the fourth divided area D4 are disposed 180 degrees away from each other with respect to the center O. The disposition of the drive terminals 14D between the first divided area D1 and the fourth divided area D4 that are adjacent to each other with the first virtual line L1 therebetween and between the second divided area D2 and the third divided area D3 that are adjacent to each other with the first virtual line L1 therebetween is not particularly limited. Similarly, the disposition of the drive terminals 14D between the first divided area D1 and the fourth divided area D4 that are adjacent to each other with the second virtual line L2 therebetween and between the second divided area D2 and the third divided area D3 that are adjacent to each other with the second virtual line L2 therebetween is not particularly limited.

In the embodiment, the drive terminals 14D are disposed so that the disposition of the drive terminals 14D in each of the divided areas D1 to D4, in which the circuit board body 10 is divided into four, is line-symmetric with respect to the first virtual line L1 and is line-symmetric with respect to the second virtual line L2. In the embodiment, the drive terminals 14D are disposed so that the disposition of the drive terminals 14D in each of the divided areas D1 to D4 is four-fold symmetric with the center O serving as the axis. The function terminals 14F are disposed at positions at which the drive terminals 14D are not disposed.

The circuit board body 10 has a middle area Rm, four corner portion areas (a first corner portion area Rc1, a second corner portion area Rc2, a third corner portion area Rc3, and a fourth corner portion area Rc4), and four side middle areas (a first side middle area Rs1, a second side middle area Rs2, a third side middle area Rs3, and a fourth side middle area Rs4). The middle area Rm is a rectangular area that is set in the middle of the circuit board body 10 and is provided so that the center of the middle area Rm coincides with the center O of the circuit board body 10. The corner portion areas Rc1 to Rc4 are rectangular areas that are set in the four corners of the circuit board body 10 and are provided so as to include four corners C1 to C4 of the circuit board body 10. The side middle areas Rs1 to Rs4 are rectangular areas that are set to include the middle along the corresponding one of the sides S1 to S4 of the circuit board body 10 and are provided so as to surround the middle area Rm in four directions.

The middle area Rm is disposed so that the middle area Rm itself is point-symmetric with respect to the center O of the circuit board body 10. The corner portion areas Rc1 to Rc4 are disposed so as to be point-symmetric with respect to the center O of the circuit board body 10. The side middle areas Rs1 to Rs4 are disposed so as to be point-symmetric with respect to the center O of the circuit board body 10. The middle area Rm is disposed so that the middle area Rm itself is line-symmetric with respect to the first virtual line L1 and the second virtual line L2. The corner portion areas Rc1 to Rc4 are disposed so as to be line-symmetric with respect to the first virtual line L1 and the second virtual line L2. The side middle areas Rs1 to Rs4 are disposed so as to be line-symmetric with respect to the first virtual line L1 and the second virtual line L2.

In the designing method, the drive terminals 14D are exclusively disposed in the middle area Rm and the corner portion areas Rc1 to Rc4. In the entirety of the middle area Rm, the drive terminals 14D are disposed in an orthogonal lattice shape of six lines by six lines. In the entirety of each of the corner portion areas Rc1 to Rc4, the drive terminals 14D are disposed in an orthogonal lattice shape of three lines by three lines. In this way, the drive terminals 14D are disposed over the terminal arrays 14R, in the middle area Rm including the center O of the circuit board body 10. The drive terminals 14D are disposed at positions closest to each of the four corners C1 to C4 of the circuit board body 10. The drive terminals 14D are disposed over the terminal arrays 14R in the corner portion areas Rc1 to Rc4 that include the corresponding one of the four corners C1 to C4 of the circuit board body 10. The function terminals 14F are not disposed in the middle area Rm and the corner portion areas Rc1 to Rc4. With such a configuration, the disposition of the drive terminals 14D in the middle area Rm and the corner portion areas Rc1 to Rc4 is set to be point-symmetric with respect to the center O of the circuit board body 10.

In the side middle areas Rs1 to Rs4, both the drive terminals 14D and the function terminals 14F are disposed. In the embodiment, the function terminals 14F are disposed in an orthogonal lattice shape of eight lines by two lines on an outer side of the side middle areas Rs1 to Rs4 (an edge side of the sides S1 to S4) and eight drive terminals 14D are disposed in one line on an inner side (center O side) of the function terminals 14F. In this way, the disposition density of the function terminals 14F is higher than the disposition density of the drive terminals 14D in the side middle areas Rs1 to Rs4, in the embodiment. The entirety of the function terminals 14F and the drive terminals 14D forms an orthogonal lattice shape of eight lines by three lines. The drive terminals 14D are disposed over the side middle areas Rs1 to Rs4 and the two corner portion areas positioned on both sides of each side middle area Rs1 to Rs4, at positions in the third line from the outer side, and the drive terminals 14D are disposed so as to be arranged in one line along the sides S1 to S4, along the entirety of the sides S1 to S4.

Here, the function terminal 14F of the embodiment includes a first function terminal 14Fa corresponding to a first function unit that is connected to the semiconductor module 3 and a second function terminal 14Fb corresponding to a second function unit that is connected to the semiconductor module 3. In the embodiment, the first function terminal 14Fa and the second function terminal 14Fb can each be regarded as a "function-based terminal". For example, the first function unit may be an audio function unit and the second function unit may be a camera function unit. Other assignments are also naturally possible. In the embodiment, in the side middle areas Rs1 to Rs4 that are the areas of the circuit board body 10 in which the function terminals 14F are disposed (function terminal disposition areas), a disposition interval ΔDa of the first function terminal 14Fa and a disposition interval ΔDb of the second function terminal 14Fb are equivalent. If a disposition interval between the connection terminals 14, in which the drive terminals 14D and the function terminals 14F are not distinguished, is defined as a "reference disposition pitch", the disposition interval ΔDa of the first function terminals 14Fa and the disposition interval ΔDb of the second function terminals 14Fb are both twice the length of the reference disposition pitch.

In each line of the side middle areas Rs1 to Rs4 in which the function terminals 14F are disposed, the first function terminals 14Fa and the second function terminals 14Fb are disposed alternately along the sides S1 to S4. The first function terminals 14Fa and the second function terminals 14Fb are disposed so as to be adjacent to each other in a direction orthogonal to the sides S1 to S4, and the drive terminals 14D are further disposed so as to be adjacent thereto. When the first function terminals 14Fa are disposed on the outermost side in the direction orthogonal to the sides S1 to S4, the second function terminal 14Fb is disposed on the inner side of each first function terminal 14Fa so as to be adjacent, and the drive terminal 14D is disposed on the further inner side of each second function terminal 14Fb so as to be adjacent. When the second function terminals 14Fb are disposed on the outermost side, the first function terminal 14Fa is disposed on the inner side of each second function terminal 14Fb, and the drive terminal 14D is disposed on the further inner side of each first function terminal 14Fa. Here, if the drive terminal 14D and the function terminals 14F of a plurality of types (the first function terminal 14Fa and the second function terminal 14Fb) are assumed to be different types of connection terminals 14, the connection terminals 14 are disposed so that the connection terminals 14 whose types that are different from each other are adjacent to each other.

In the embodiment, in each of the first side middle area Rs1 and the third side middle area Rs3, the disposition of the drive terminals 14D, the first function terminals 14Fa, and the second function terminals 14Fb is point-symmetric with respect to the center O of the circuit board body 10. In the embodiment, the disposition of the drive terminals 14D, the first function terminals 14Fa, and the second function terminals 14Fb in the areas Rs1, Rs3 is not line-symmetric with respect to the second virtual line L2. In each of the second side middle area Rs2 and the fourth side middle area Rs4, the disposition of the drive terminals 14D, the first function terminals 14Fa, and the second function terminals 14Fb is point-symmetric with respect to the center O of the circuit board body 10. In the embodiment, the disposition of the drive terminals 14D, the first function terminals 14Fa, and the second function terminals 14Fb in the areas Rs2, Rs4 is not line-symmetric with respect to the first virtual line L1. The disposition of the drive terminals 14D, the first function terminals 14Fa, and the second function terminals 14Fb in each of the side middle areas Rs1 to Rs4 is four-fold symmetric with the center O of the circuit board body 10 serving as an axis.

In this way, in the designing method, the drive terminals 14D, the first function terminals 14Fa, and the second function terminals 14Fb are disposed so that the disposition of the drive terminals 14D, the first function terminals 14Fa, and the second function terminals 14Fb in each of the four divided areas D1 to D4 is point-symmetric with respect to the center O of the circuit board body 10, within the entire circuit board 1. The drive terminals 14D, the first function terminal 14Fa, and the second function terminals 14Fb are disposed so that the disposition of the drive terminals 14D, the first function terminals 14Fa, and the second function terminals 14Fb in each of the four divided areas D1 to D4 is four-fold symmetric with the center O of the circuit board body 10 serving as the axis.

Figure 4:
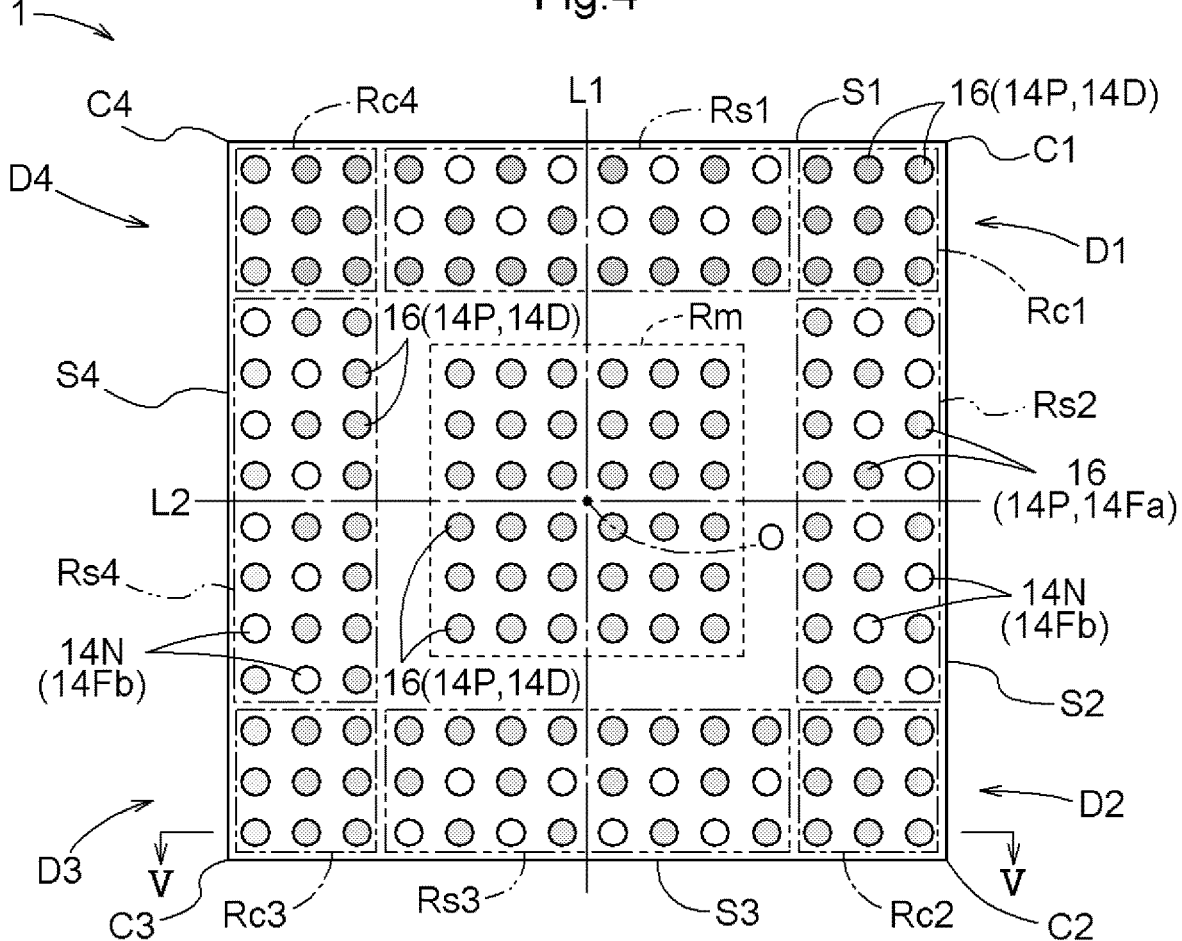
FIG. 4 is a schematic view of an example of the disposition configuration of each connection pin.
Figure 5:
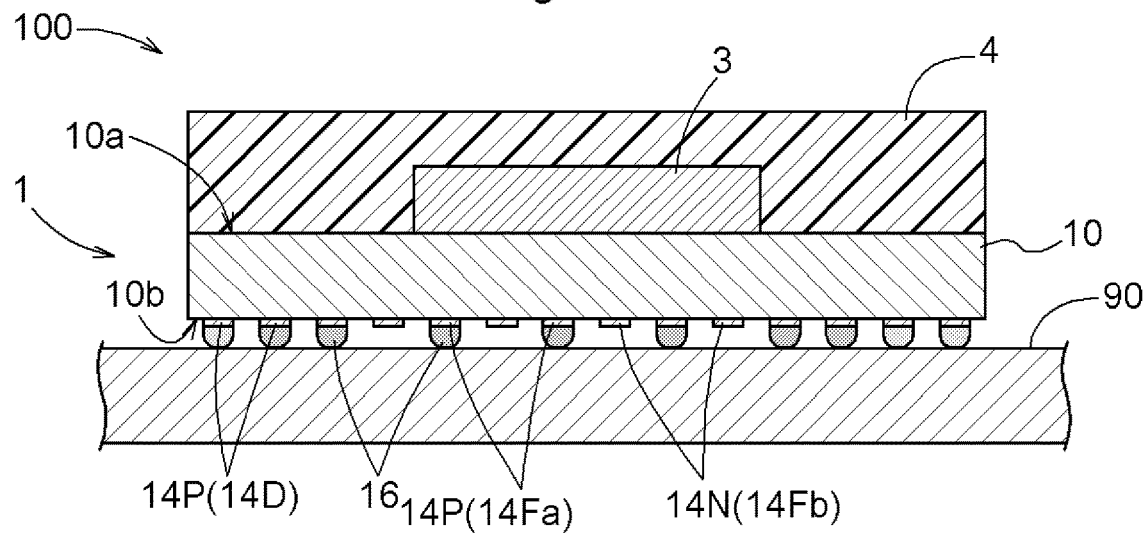
FIG. 5 is a sectional view of an example of each connection pin.

As described above, the connection pin 16 is usually provided on each connection terminal 14 (the drive terminal 14D, the first function terminal 14Fa, and the second function terminal 14Fb) so as to protrude from the lower face 10b of the circuit board body 10. However, it is preferable that the connection pin 16 provided on the second function terminal 14Fb corresponding to the second function unit be not provided, if the second function unit is not used in a configuration of a system and the time and effort necessary for confirming insulation are taken into consideration. FIGS. 4 and 5 illustrate the circuit board 1 acquired in this way.

As illustrated in FIGS. 4 and 5, the connection pin 16 is provided on some connection terminals 14 and the connection pin 16 is not provided on some of the other connection terminals 14. In the embodiment, the connection terminal 14 that is provided with the connection pin 16 is called "a pin terminal 14P" and the connection terminal 14 that is not provided with the connection pin 16 is called "a pin-less terminal 14N". In the example illustrated in FIGS. 4 and 5, the drive terminal 14D and the first function terminal 14Fa described above is the pin terminal 14P and the second function terminal 14Fb described above is the pin-less terminal 14N. Since the circuit board 1 that is designed based on the designing method is configured so that the pin terminal 14P is disposed so as to be evenly dispersed over the entire circuit board 1, the circuit board 1 is not easily tilted even if the connection pin 16 is not provided on some connection terminals 14 (that is, on the second function terminals 14Fb that are the pin-less terminals 14N). An operation related to the second function terminals 14Fb such as confirming insulation is unnecessary since the unnecessary second function terminals 14Fb are set as the pin-less terminals 14N.

Figure 6:
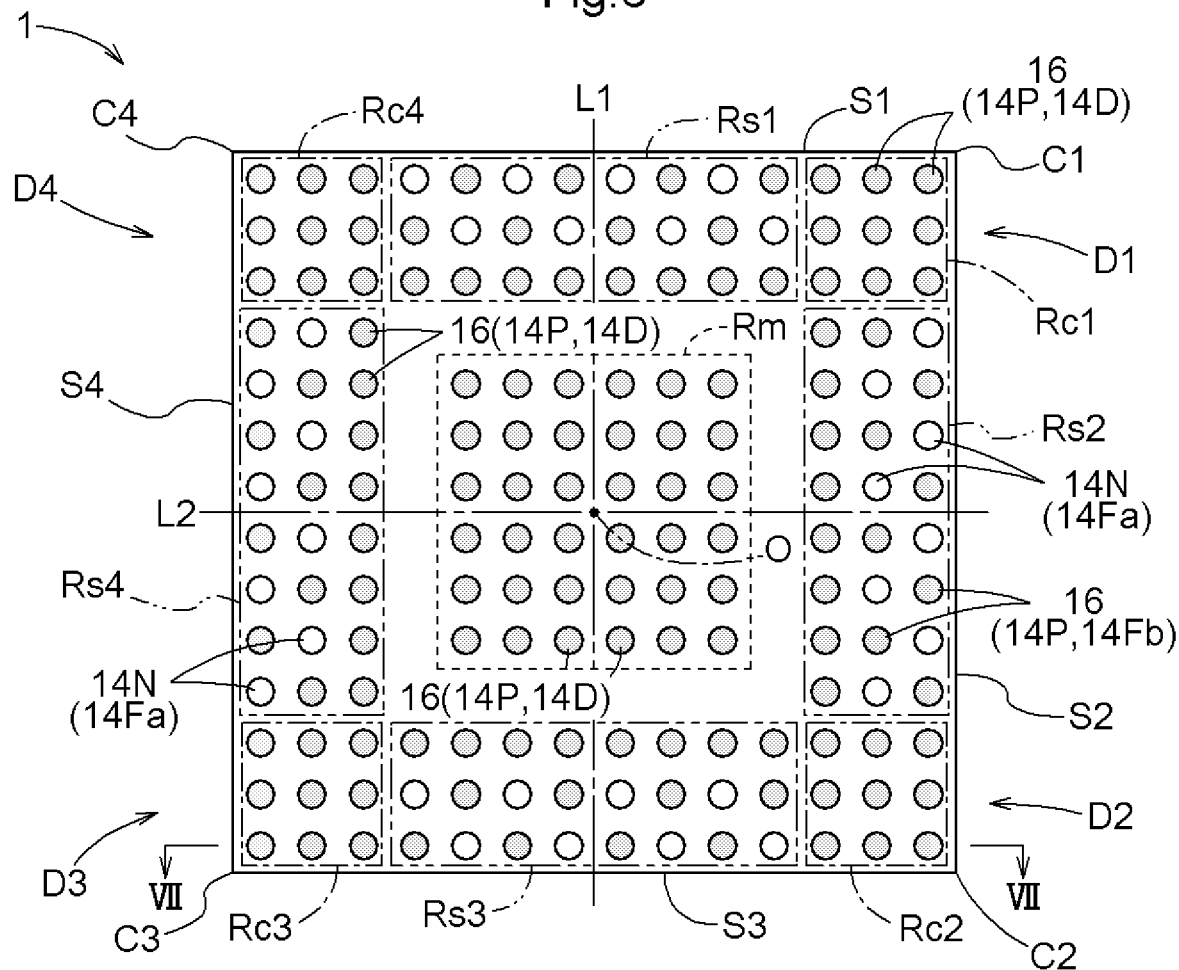
FIG. 6 is a schematic view of another example of the disposition configuration of each connection pin.
Figure 7:
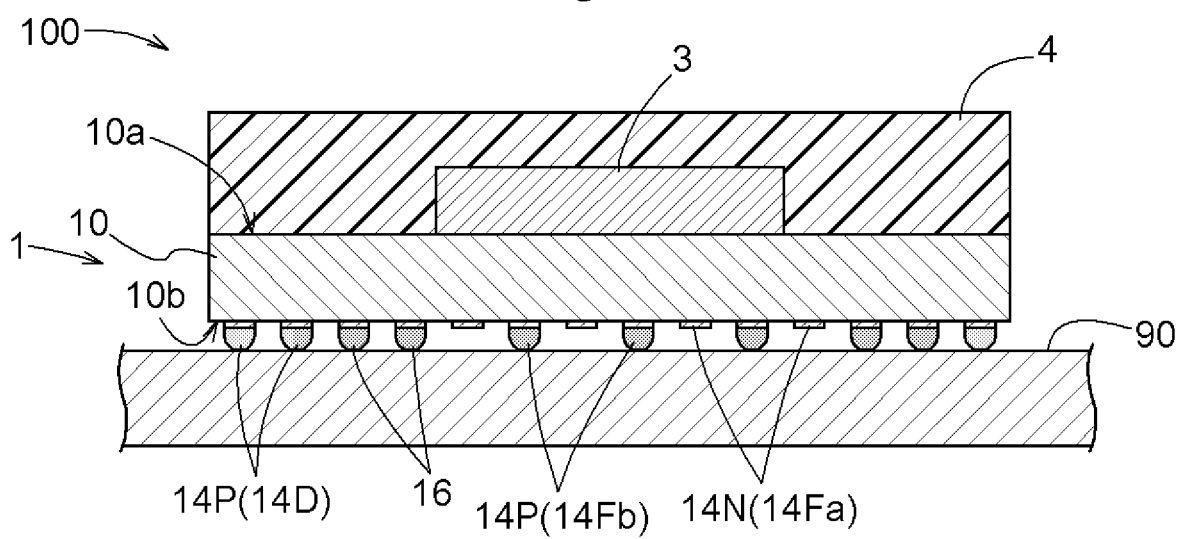
FIG. 7 is a sectional view of another example of the disposition configuration of each connection pin.

Similarly, it is preferable that the connection pins 16 provided on the first function terminals 14Fa that correspond to the first function unit be not provided, if the first function unit is not used in a configuration of a system. FIGS. 6 and 7 illustrate the circuit board 1 acquired in this way.

In the example illustrated in FIGS. 6 and 7, the drive terminals 14D and the second function terminals 14Fb are the pin terminals 14P and the first function terminals 14Fa are the pin-less terminals 14N. Since the circuit board 1 that is designed based on the designing method is configured so that the pin terminals 14P are disposed so as to be evenly dispersed, the circuit board 1 is not easily tilted even if the connection pin 16 is not provided on some connection terminals 14 (that is, on the first function terminals 14Fa that are the pin-less terminals 14N). An operation related to the first function terminal 14Fa such as confirming insulation is unnecessary since the unnecessary first function terminals 14Fa are set as the pin-less terminals 14N.

Although not shown in the drawings, if all functions of a configuration of a system are used, all of the drive terminals 14D, the first function terminals 14Fa, and the second function terminals 14Fb (in other words, all of the connection terminals 14) are set as the pin terminals 14P, and as a matter of course, the circuit board 1 is less likely to be tilted. In this way, by designing the circuit board 1 based on the designing method, it is possible to suppress the circuit board 1 from tilting even if the connection pin 16 is not provided on some connection terminals 14, regardless of the utilized functions, which differ for every system configuration. When connecting the semiconductor device 100 to the system circuit board 90 with reflow soldering afterwards, it is possible to suppress the semiconductor device 100 from tilting and maintain the attitude appropriately. Since the pin terminals 14P are disposed so as to be evenly dispersed over the entire circuit board 1 and points that are joined by soldering are also dispersed over the entire circuit board 1, it is possible to suppress the circuit board 1 from warping, which results from a difference in thermal expansion coefficients. It is also possible to significantly reduce development time and development cost, compared to when new corresponding packages are each produced in consideration of the variation in functions that are actually used in each system.

The circuit board 1 illustrated in FIGS. 4 to 7 that is produced based on the designing method and in which the connection pin 16 is not provided on some connection terminals 14 has the following featured configuration. That is, the disposition of the pin terminals 14P in each of the divided areas D1 to D4 is point-symmetric with respect to the center O of the circuit board body 10. Here, the divided areas D1 to D4 are divided into four with the two virtual lines L1, L2 that pass through the middle of the sides S1 to S4 of the circuit board body 10 and that intersect at the center O of the lower face 10b. In the embodiment, the disposition of the pin terminals 14P in each of the four divided areas D1 to D4 is four-fold symmetric with the center O of the circuit board body 10 serving the axis. The pin terminals 14P are disposed at the positions closest to each of the four corners C1 to C4 of the circuit board body 10 and the pin terminals 14P are disposed over the terminal arrays 14R in the corner portion areas Rc1 to Rc4 that include the corresponding one of the four corners C1 to C4 of the circuit board body 10.

In the side middle areas Rs1 to Rs4, each connection terminal 14 that is adjacent to the pin-less terminal 14N is the pin terminal 14P. The connection terminal 14 that is adjacent to the pin terminal 14P is not always limited to the pin-less terminal 14N, and is the pin-less terminal 14N or another pin terminal 14P. The pin terminals 14P are disposed so as to be arranged along the sides S1 to S4 of the circuit board body 10, over the side middle areas Rs1 to Rs4 and the corner portion areas on both sides of the side middle areas Rs1 to Rs4. The pin terminals 14P are disposed at the positions in the third line from the edge of the sides S1 to S4, and the pin terminals 14P are disposed so as to be arranged in one line along the sides S1 to S4.

Figure 13:
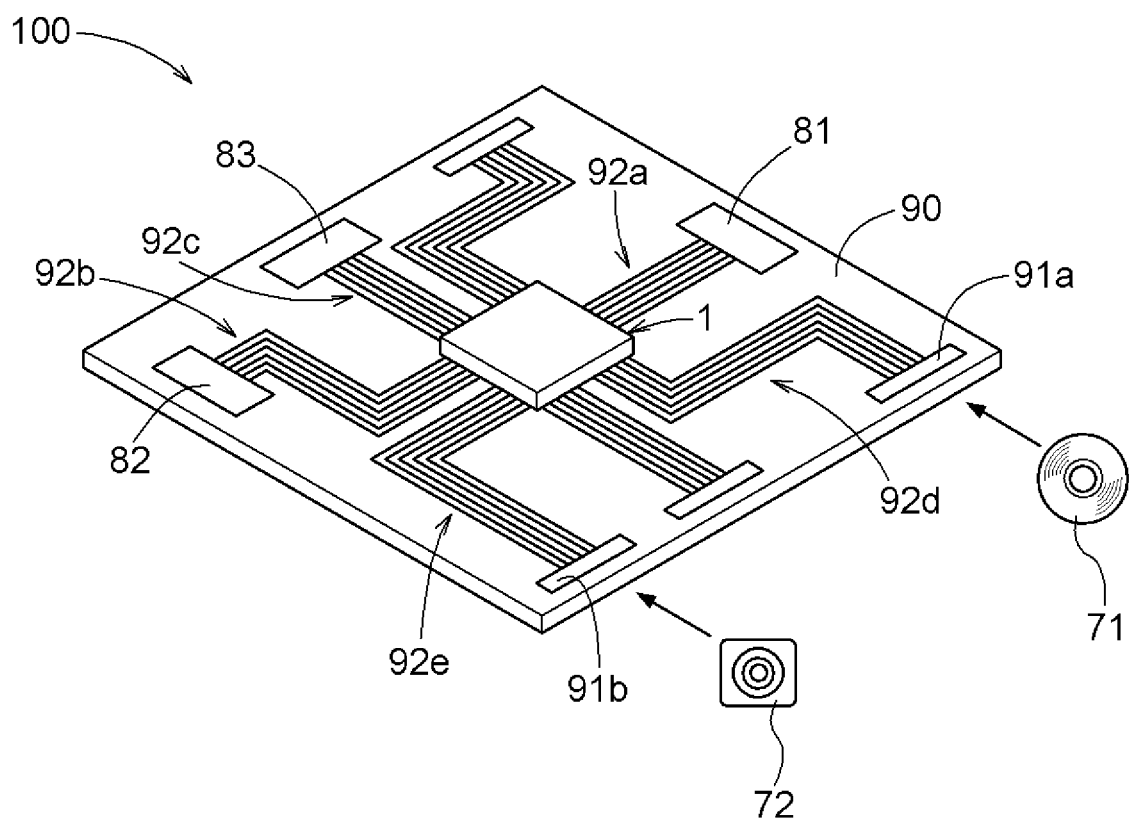
FIG. 13 is a schematic view of a relationship between the semiconductor device and surrounding devices.

FIG. 13 illustrates a more specific configuration of the semiconductor device 100 in which the circuit board 1 described above is placed. The semiconductor device 100 is used as a core that drives a multimedia system in which an audio device, a navigation device, and the like are integrated, the multimedia system being installed in a vehicle such as an automobile, for example. The semiconductor device 100 is used as a core that drives a multimedia system in which an audio device, a navigation device, and the like are integrated, the multimedia system being installed in a vehicle such as an automobile, for example. In the system, the semiconductor device 100 according to the embodiment is commonly used to attain a plurality of functions such as an audio function, a navigation function, and a camera function.

As illustrated in FIG. 13, the semiconductor device 100 has the circuit board 1 and the system circuit board 90 on which the circuit board 1 is surface-mounted. The circuit board 1 is formed to have a rectangular shape when viewed in plan. The semiconductor module 3 is installed on the upper face and the connection terminals 14 are provided on the lower face of the circuit board 1 that has the rectangular shape when viewed in plan (see FIG. 1). Among the connection terminals 14, at least some connection terminals 14 are provided with the connection pin 16 that protrudes from the lower face of the circuit board 1. The circuit board 1 is surface-mounted on the system circuit board 90 via the connection terminals 14 and the connection pins 16 that are provided on the lower face of the circuit board 1. In the embodiment, the system circuit board 90 can be regarded as a "main circuit board".

The semiconductor device 100 is connected to a monitor device (not shown) that is installed in a console portion and a hard disk device (not shown) in which a map database of a navigation system etc. is stored. As illustrated schematically in FIG. 13, the semiconductor device 100 is connected to a digital versatile disk (DVD) player 71 that plays a DVD or a compact disk (CD) etc. and a rear camera 72 that captures a rear view of the vehicle. In the embodiment, the DVD player 71 can be regarded as an "audio function unit" and the rear camera can be regarded as a "camera function unit".

A power source unit 81, a clock unit 82, and a reset unit 83 are disposed on the system circuit board 90. The power source unit 81 supplies operating power of the semiconductor module 3. The power source unit 81 is connected to the drive terminals 14D of the circuit board 1 via a first surface electrode pattern 92a. The clock unit 82 generates clock signals for a synchronization process. The clock unit 82 is connected to the drive terminals 14D of the circuit board 1 via a second surface electrode pattern 92b. The reset unit 83 resets the state of the processor for normal operation when the power is turned on. The reset unit 83 is connected to the drive terminals 14D of the circuit board 1 via a third surface electrode pattern 92c.

A first circuit board terminal 91a to which the DVD player 71 is connected and a second circuit board terminal 91b to which the rear camera 72 is connected are provided on the system circuit board 90. The first circuit board terminal 91a is connected to the function terminals 14F (first function terminals 14Fa) of the circuit board 1 via a fourth surface electrode pattern 92d. In this way, the DVD player 71 is connected to the function terminals 14F (first function terminals 14Fa) via the first circuit board terminal 91a and the fourth surface electrode pattern 92d. The second circuit board terminal 91b is connected to the function terminals 14F (second function terminals 14Fb) of the circuit board 1 via a fifth surface electrode pattern 92e. In this way, the rear camera 72 is connected to the function terminals 14F (second function terminals 14Fb) via the second circuit board terminal 91b and the fifth surface electrode pattern 92e.

In the specific example, the drive terminals 14D are the connection terminals 14 for connecting the semiconductor module 3 that is provided on the upper face of the circuit board 1 and the power source unit 81, the connection terminals 14 for connecting the semiconductor module 3 and the clock unit 82, and the connection terminals 14 for connecting the semiconductor module 3 and the reset unit 83. The function terminals 14F are the connection terminals 14 for connecting the semiconductor module 3 that is provided on the upper face of the circuit board 1 and the circuit board terminals 91a, 91b. Among the function terminals 14F, the first function terminals 14Fa are the connection terminals 14 for connecting the semiconductor module 3 and the first circuit board terminal 91a and the second function terminals 14Fb are the connection terminals 14 for connecting the semiconductor module 3 and the second circuit board terminal 91b.

In such a semiconductor device 100, in the circuit board 1, the disposition of the drive terminals 14D in each of the divided areas D1 to D4 is point-symmetric with respect to the center O of the circuit board body 10. Here, the divided areas D1 to D4 are divided into four with the two virtual lines L1, L2 that pass through the middle of the sides S1 to S4 of the circuit board body 10 and that intersect at the center O of the lower face 10b. The disposition of the drive terminals 14D in each of the four divided areas D1 to D4 is four-fold symmetric with the center O of the circuit board body 10 serving as the axis. The drive terminals 14D are disposed at positions closest to each of the four corners C1 to C4 of the circuit board body 10. The drive terminals 14D are disposed over the terminal arrays 14R in the corner portion areas Rc1 to Rc4 that include the corresponding one of the four corners C1 to C4 of the circuit board body 10.

In the side middle area Rs1 to Rs4 of the circuit board body 10, the drive terminals 14D are disposed so as to be arranged along the sides S1 to S4 of the circuit board body 10, over the side middle areas Rs1 to Rs4 and the corner portion areas on both sides of the side middle areas Rs1 to Rs4. The drive terminals 14D are disposed at the positions in the third line from the edge of the sides S1 to S4, and the drive terminals 14D are disposed so as to be arranged in one line along the sides S1 to S4.

In each line of the side middle areas Rs1 to Rs4 in which the function terminals 14F are disposed, the first function terminals 14Fa and the second function terminals 14Fb are disposed alternately along the sides S1 to S4. The first function terminals 14Fa and the second function terminals 14Fb are disposed so as to be adjacent to each other in a direction orthogonal to the sides S1 to S4, and the drive terminals 14D are further disposed so as to be adjacent thereto. When the drive terminals 14D and the function terminals 14F (the first function terminals 14Fa and the second function terminals 14Fb) are assumed to be different types of connection terminals 14, the connection terminals 14 are disposed so that the connection terminals 14 whose types are different from each other are adjacent to each other.

Figure 8:
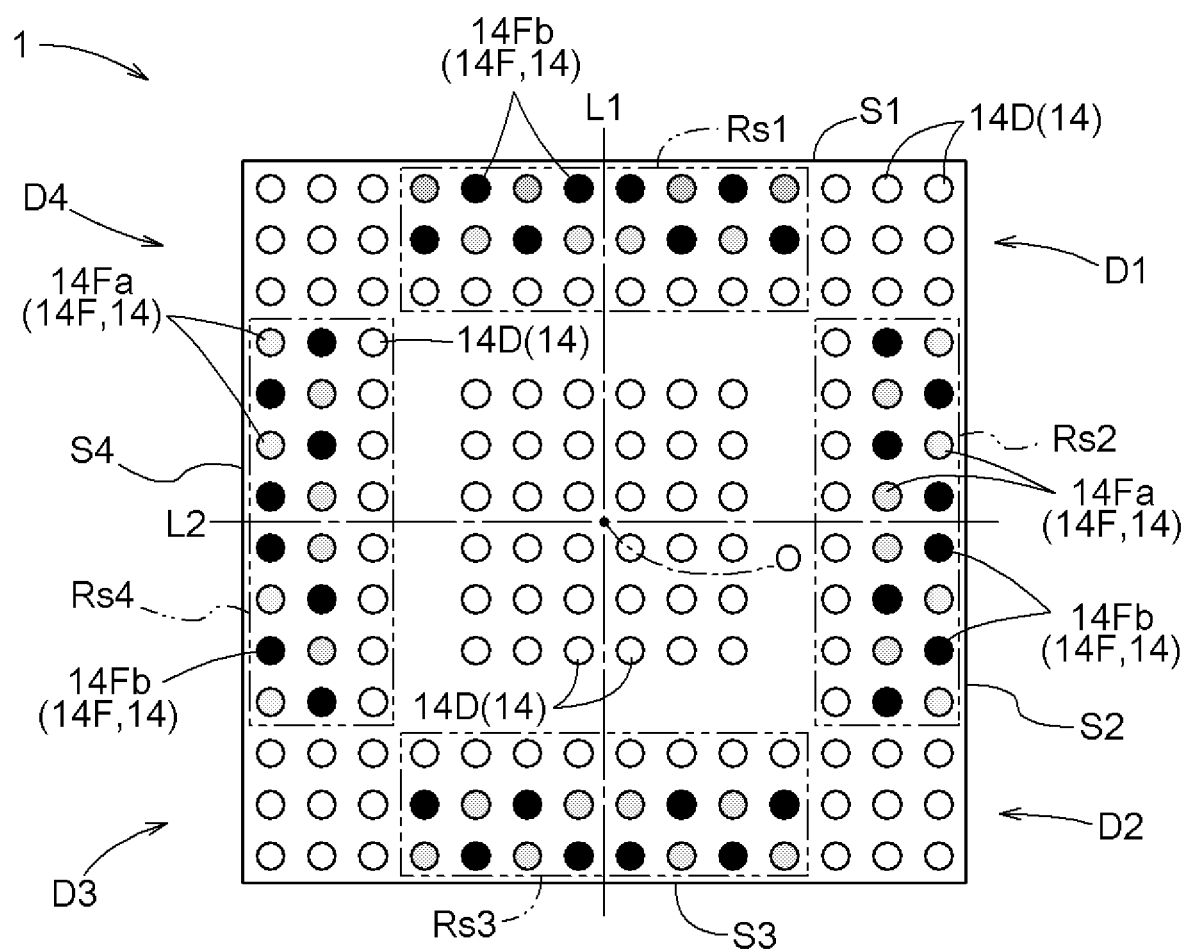
FIG. 8 is an explanatory view of another designing method of the disposition of each connection terminal.

OTHER EMBODIMENTS (1) In the above embodiment, an example of a configuration has been described in which the disposition of the drive terminals 14D, the first function terminals 14Fa, and the second function terminals 14Fb in each of the four divided areas D1 to D4 is point-symmetric with respect to the center O of the circuit board body 10 and are four-fold symmetric with the center O serving as the axis. However, the configuration is not limited to this. For example, as illustrated in FIG. 8, the disposition of the drive terminals 14D, the first function terminals 14Fa, and the second function terminals 14Fb in each of the four divided areas D1 to D4 may be point-symmetric with respect to the center O of the circuit board body 10 and line-symmetric with respect to the first virtual line L1 and the second virtual line L2. As in such a case, the first function terminals 14Fa and the second function terminals 14Fb do not have to be disposed alternately along the sides S1 to S4. If at least the disposition of the drive terminals 14D in each of the four divided areas D1 to D4 is point-symmetric with respect to the center O of the circuit board body 10, the first function terminals 14Fa and the second function terminals 14Fb may be disposed randomly.

(2) In the above embodiment, an example of a configuration has been described in which the drive terminals 14D are disposed at the positions closest to the four corners C1 to C4 of the circuit board body 10. However, the configuration is not limited to this. If at least the disposition of the drive terminals 14D in each of the four divided areas D1 to D4 is point-symmetric with respect to the center O of the circuit board body 10, the function terminals 14F may be disposed at the positions closest to the four corners C1 to C4 of the circuit board body 10, for example.

(3) In the above embodiment, an example of a configuration has been described in which the drive terminals 14D are disposed over the terminal arrays 14R, in the corner portion areas Rc1 to Rc4 including the four corners C1 to C4 of the circuit board body 10. However, the configuration is not limited to this. The drive terminals 14D may be disposed in only one line, in the corner portion areas Rc1 to Rc4, for example.

(4) In the above embodiment, an example of a configuration has been described in which the drive terminals 14D are disposed over the entirety of the sides S1 to S4 so as to be disposed in one line along the sides S1 to S4, in the side middle areas Rs1 to Rs4. However, the configuration is not limited to this. The drive terminals 14D may be disposed at every other position in one line, in the side middle areas Rs1 to Rs4 (see FIG. 11). Alternatively, the drive terminals 14D may be disposed alternately (in a zigzag shape) over two lines, in the side middle areas Rs1 to Rs4.

Figure 9:
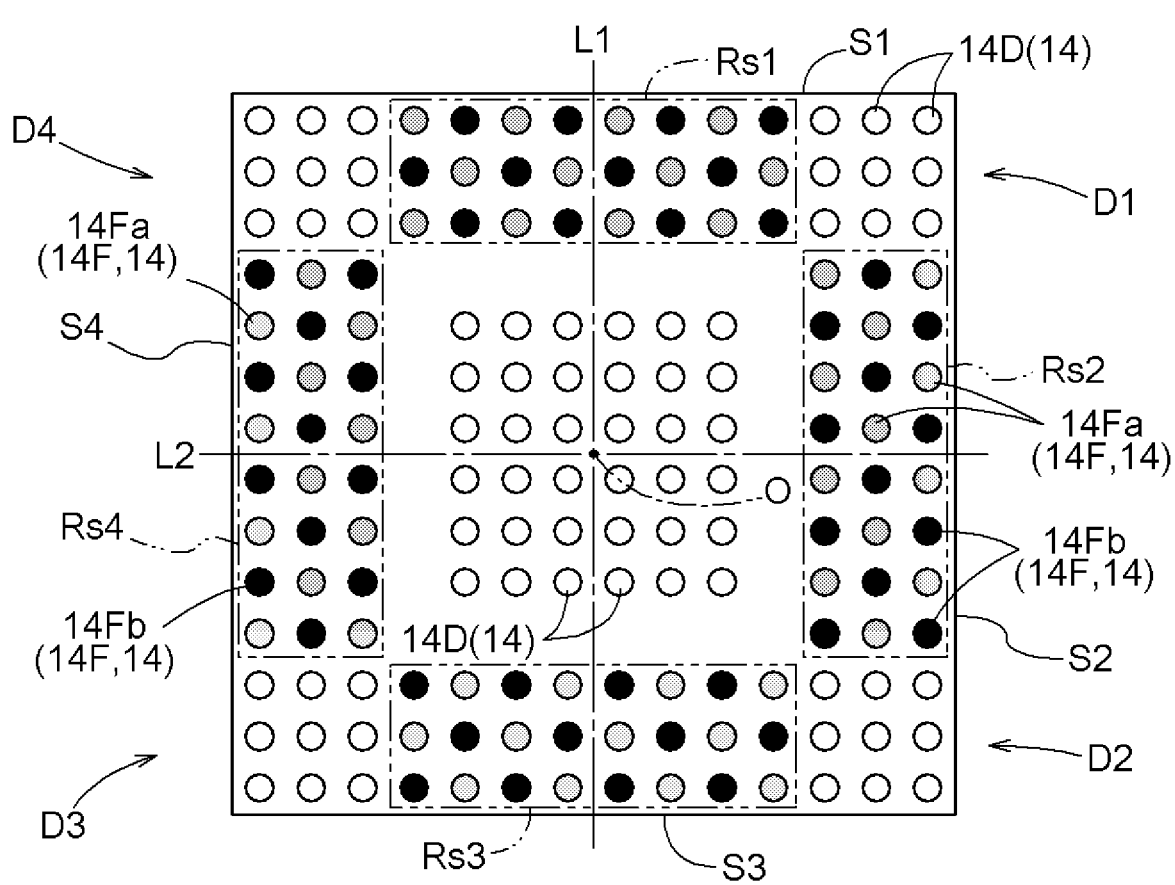
FIG. 9 is an explanatory view of yet another designing method of the disposition of each connection terminal.

(5) In the above embodiment, an example of a configuration has been described in which the drive terminals 14D are also disposed in the side middle areas Rs1 to Rs4. However, the configuration is not limited to this. For example, only the function terminals 14F, and not the drive terminals 14D, may be disposed in the side middle areas Rs1 to Rs4, as illustrated in FIG. 9. In this case, the first function terminals 14Fa and the second function terminals 14Fb may be arranged in a staggered manner in the entire area of the side middle areas Rs1 to Rs4, as in the illustrated example.

(6) In the above embodiment, an example of a configuration has been described in which the disposition density of the function terminals 14F is higher than the disposition density of the drive terminals 14D in the side middle areas Rs1 to Rs4. However, the configuration is not limited to this. For example, in the side middle areas Rs1 to Rs4, the disposition density of the function terminals 14F may be equal to the disposition density of the drive terminals 14D, or the disposition density of the function terminals 14F may be lower than the disposition density of the drive terminals 14D.

(7) In the above embodiment, an example of a configuration has been described in which the disposition interval ΔDa of the first function terminals 14Fa and the disposition interval ΔDb of the second function terminals 14Fb are equivalent, in the side middle areas Rs1 to Rs4. However, the configuration is not limited to this. The disposition interval ΔDa of the first function terminals 14Fa and the disposition interval ΔFb of the second function terminals 14Fb in the side middle areas Rs1 to Rs4 may be different from each other.

(8) In the above embodiment, an example of a configuration has been described in which the first function terminals 14Fa and the second function terminals 14Fb are disposed alternately along the sides S1 to S4, in the side middle areas Rs1 to Rs4. However, the configuration is not limited to this. For example, two first function terminals 14Fa and two second function terminals 14Fb may be disposed alternately along the sides S1 to S4, in the side middle areas Rs1 to Rs4.

Figure 10:
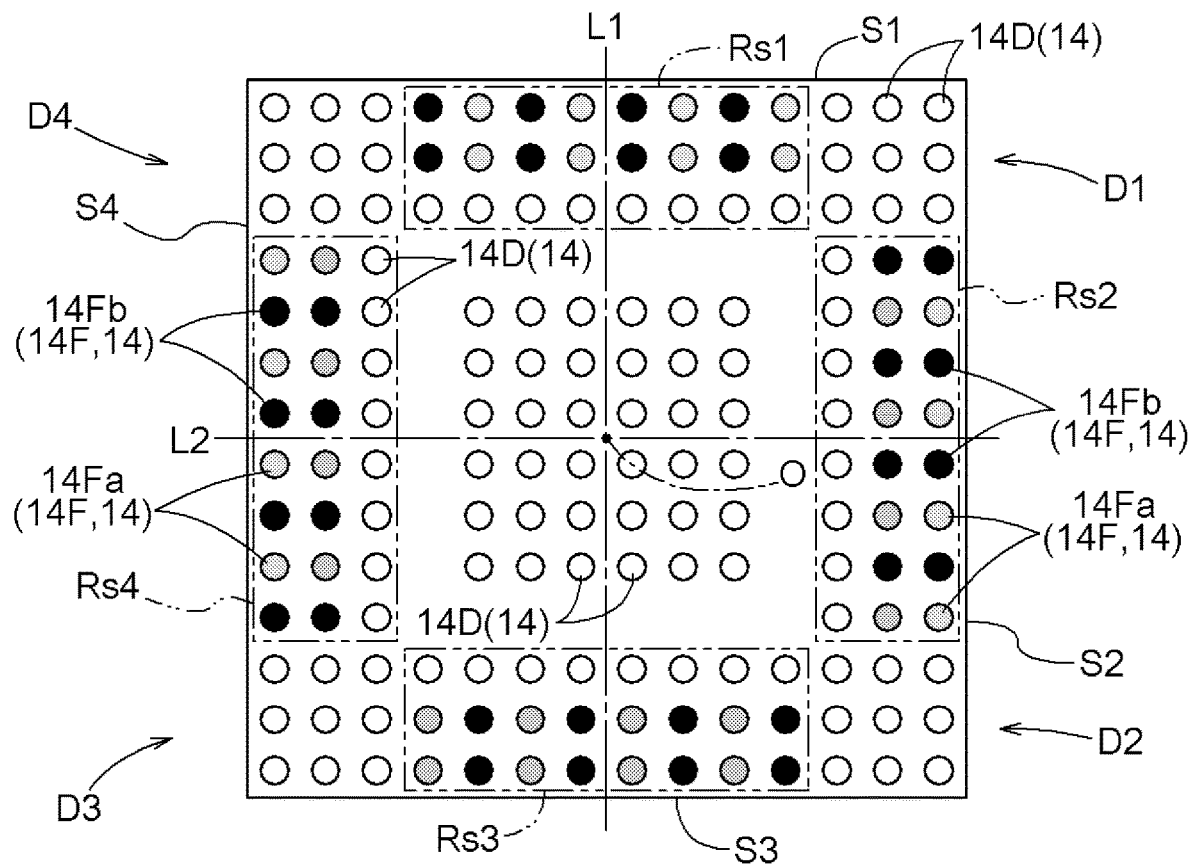
FIG. 10 is an explanatory view of still another designing method of the disposition of each connection terminal.

(9) In the above embodiment, an example of a configuration has been described in which the first function terminals 14Fa and the second function terminals 14Fb are disposed so as to be adjacent in the direction orthogonal to the sides S1 to S4. However, the configuration is not limited to this. For example, as illustrated in FIG. 10, the first function terminals 14Fa and the second function terminals 14Fb may be disposed so that in the direction orthogonal to the sides S1 to S4, the first function terminals 14Fa are adjacent to each other and the second function terminals 14Fb are adjacent to each other. In this way, the connection terminals 14 of the same type may be disposed so as to be adjacent in the direction orthogonal to the sides S1 to S44.

Figure 11:
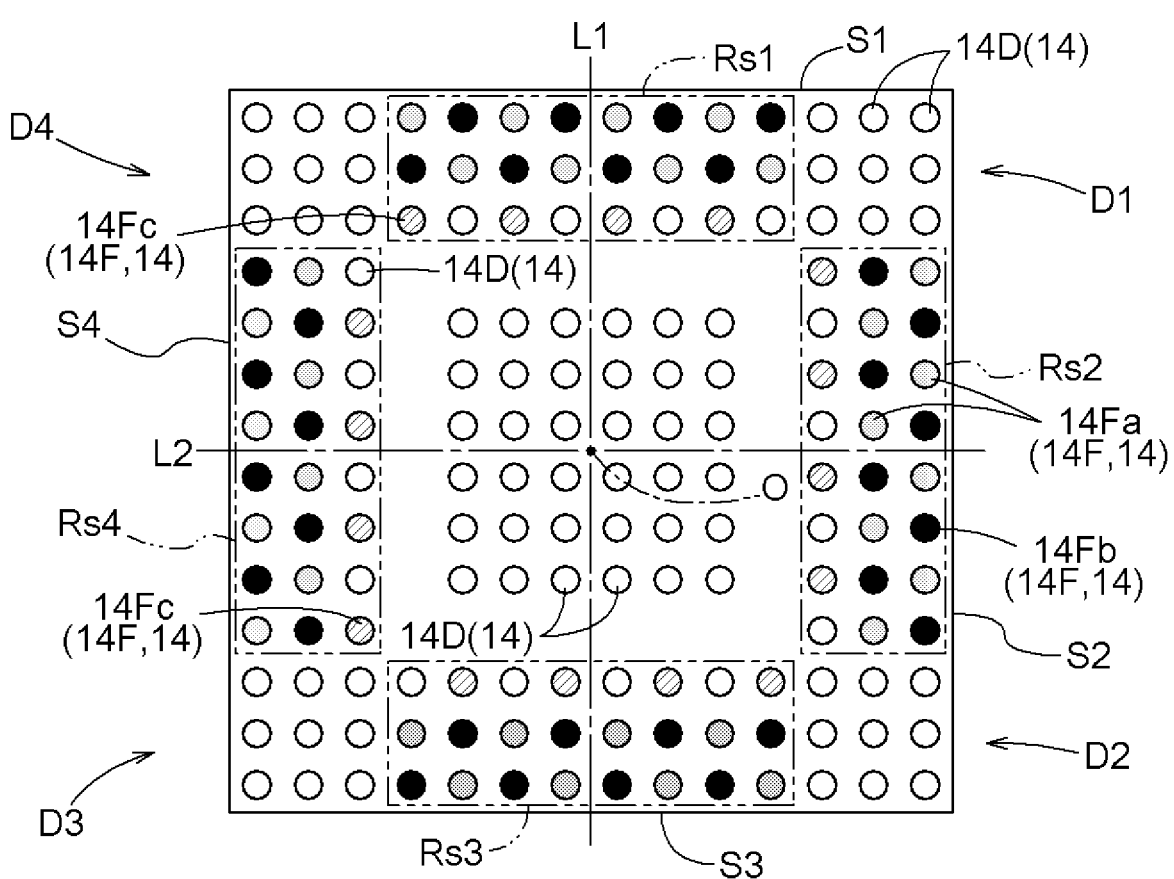
FIG. 11 is an explanatory view of a further designing method of the disposition of each connection terminal.
Figure 12:
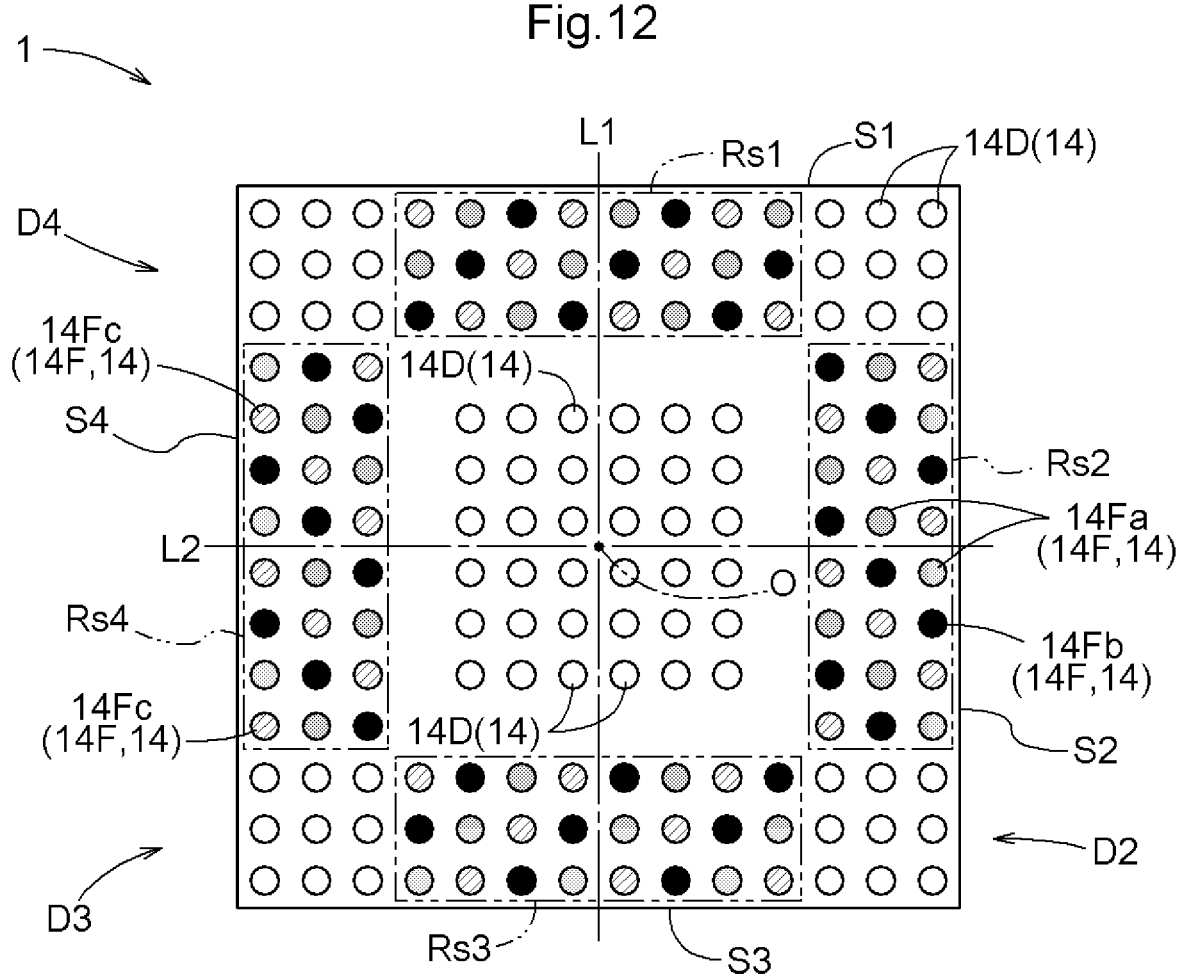
FIG. 12 is an explanatory view of yet a further designing method of the disposition of each connection terminal.

(10) In the above embodiment, an example of a configuration has been described in which the function terminals 14F only include the first function terminals 14Fa and the second function terminals 14Fb. However, the configuration is not limited to this. For example, the function terminals 14F may be configured to further include third function terminals 14Fc (another example of the "function-based terminal"). In such a case, the third function terminals 14Fc may be disposed alternately with the drive terminals 14D to form one line with the drive terminals 14D in the side middle areas Rs1 to Rs4, as illustrated in FIG. 11. Alternatively, as illustrated in FIG. 12, the first function terminals 14Fa, the second function terminals 14Fb, and the third function terminals 14Fc may be disposed uniformly while being sequentially shifted in a regular manner in a configuration in which the drive terminals 14D are not provided in the side middle areas Rs1 to Rs4.

(11) In the above embodiment, if the connection terminals 14 adjacent to the pin-less terminals 14N are the pin terminals 14P and the pin terminals 14P are disposed at positions closest to the four corners C1 to C4 of the circuit board body 10, the disposition of the pin terminals 14P in each of the four divided areas D1 to D4 do not have to be point-symmetric with respect to the center O of the circuit board body 10.

(12) The configurations disclosed in the above embodiments (including the above embodiment and the other embodiments; the same applies hereinafter) may be applied and combined with the configurations disclosed in the other embodiments as long as no inconsistency arises. Regarding other configurations as well, the embodiments disclosed in the specification are shown by way of example in all respects, and various modifications may be made as appropriate without departing from the spirit and scope of the disclosure.

SUMMARY OF EMBODIMENTS

Based on the above description, a first circuit board according to the disclosure preferably includes the following configurations.

A circuit board (1) that is formed to have a rectangular shape when viewed in plan, that is installed with a semiconductor module (3) on an upper face (10a), and that is provided with a plurality of connection terminals (14) on a lower face (10b), in which a connection pin (16) protruding from the lower face (10b) is provided on at least some connection terminals (14), the connection terminals (14) include a drive terminal (14D) for driving the semiconductor module (3) and a function terminal (14F) for connecting the semiconductor module (3) and other function units, and the disposition of the drive terminal (14D) in each of divided areas is point-symmetric with respect to the center (O) of the lower face (10b), the divided areas being the lower face (10b) divided into four with two virtual lines (L1, L2) that pass through the middle of each side of the lower face (10b) and that intersect at the center (O) of the lower face (10b).

With such a configuration, the circuit board (1) is less likely to be tilted when the circuit board (1) is connected to another circuit board such as a system circuit board, even if the connection pin (16) is not provided on some function terminals (14F), since the disposition of the drive terminals (14D) in each of the four divided areas (D1 to D4) is point-symmetric with respect to the center (O) of the lower face (10b). It is thus possible to realize the circuit board (1) that is less likely to be tilted when the circuit board (1) is connected to another circuit board even when there is an unused terminal in a part of the circuit board (1).

As one aspect, it is preferable that the drive terminal (14D) be disposed at a position closest to a corner (C1 to C4) of the lower face (10b).

With such a configuration, the circuit board (1) is supported by the connection pin (16) at four points in the least, the four points being at the outermost positions of the rectangular circuit board (1). It is thus possible to effectively suppress the circuit board (1) from being tilted when the circuit board (1) is connected to another circuit board.

As one aspect, it is preferable that the connection terminals (14) be disposed along each side (S1 to S4) of the lower face (10b) so as to form a plurality of terminal arrays (14R) from an outer edge of the lower face (10b), and the drive terminal (14D) be disposed over the terminal arrays (14R) in a corner portion area (Rc1 to Rc4) including a corner (C1 to C4) of the lower face (10b).

With such a configuration, the circuit board (1) is supported by the connection pin (16) at a larger area of the four corners of the rectangular circuit board (1). It is thus possible to effectively suppress the circuit board (1) from being tilted when the circuit board (1) is connected to another circuit board.

As one aspect, it is preferable that the drive terminal (14D) be disposed so as to be arranged along each side (S1 to S4) of the lower face (10b).

With such a configuration, the circuit board (1) is supported by the connection pin (16) along each of the four sides of the rectangular circuit board (1). It is thus possible to effectively suppress the circuit board (1) from being tilted when the circuit board (1) is connected to another circuit board and suppress the circuit board (1) from being warped when the circuit board (1) is heated.

As one aspect, it is preferable that the disposition density of the function terminals (14F) be higher than the disposition density of the drive terminals (14D) in each side middle area (Rs1 to Rs4) that is an outer edge area along the each side (S1 to S4) of the lower face (10b) and that includes the middle of the sides (S1 to S4).

With such a configuration, it is possible to dispose many function terminals (14F) while suppressing the effect on the tilt of the circuit board (1) when the circuit board (1) is connected to another circuit board.

As one aspect, it is preferable that the function terminal (14F) includes a first function terminal (14Fa) corresponding to a first function unit that is connected to the semiconductor module (3) and a second function terminal (14Fb) corresponding to a second function unit that is connected to the semiconductor module (3), and the first function terminal (14Fa) and the second function terminal (14Fb) be disposed alternately in a function terminal disposition area of the lower face (10b) in which the function terminal (14F) is disposed.

With such a configuration, the entire circuit board (1) is generally uniformly supported by the connection pins (16) even when the connection pin (16) is not provided for the unnecessary function terminal (14F) in each function terminal disposition area. It is thus possible to effectively suppress the circuit board (1) from being tilted when the circuit board (1) is connected to another circuit board and suppress the circuit board (1) from being warped when the circuit board (1) is heated.

As one aspect, it is preferable that the function terminals (14F) include a first function terminal (14Fa) corresponding to a first function unit that is connected to the semiconductor module (3) and a second function terminal (14Fb) corresponding to a second function unit that is connected to the semiconductor module (3), and that a disposition interval (ΔDa) of the first function terminal (14Fa) and a disposition interval (ΔDb) of the second function terminal (14Fb) be equivalent, in the function terminal disposition area of the lower face (10b) in which the function terminal (14F) is disposed.

With such a configuration, the entire circuit board (1) is generally uniformly supported by the connection pins (16) even when the connection pin (16) is not provided for the unnecessary function terminal (14F) in each function terminal disposition area. It is thus possible to effectively suppress the circuit board (1) from being tilted when the circuit board (1) is connected to another circuit board and suppress the circuit board (1) from being warped when the circuit board (1) is heated.

As one aspect, it is preferable that the connection terminals (14) be disposed along each side (S1 to S4) of the lower face (10b) so as to form a plurality of terminal arrays (14R) from an outer edge of the lower face (10b), the function terminal includes function-based terminals of various types that respectively correspond to a plurality of functions executed by the semiconductor module, and two types of function-based terminals be disposed alternately in each of the terminal arrays (14R).

With such a configuration, the entire circuit board (1) is generally uniformly supported by the connection pins (16) even when the connection pin (16) is not provided for the unnecessary function terminal (14F). It is thus possible to effectively suppress the circuit board (1) from being tilted when the circuit board (1) is connected to another circuit board and suppress the circuit board (1) from being warped when the circuit board (1) is heated.

As one aspect, it is preferable that the drive terminal (14D) and the function-based terminals of various types be assumed to be different types of connection terminals (14), and the connection terminals (14) whose types are different from each other be disposed to be adjacent to each other in a direction orthogonal to each side (S1 to S4) of the lower face (10b).

With such a configuration, the entire circuit board (1) is further uniformly supported by the connection pins (16) even when the connection pin (16) is not provided for the unnecessary function terminal (14F). It is thus possible to further effectively suppress the circuit board (1) from being tilted when the circuit board (1) is connected to another circuit board and effectively suppress the circuit board (1) from being warped when the circuit board (1) is heated.

In the first circuit board of each configuration described above, it is preferable that a first divided area (D1), a second divided area (D2) adjacent to the first divided area (D1) with one of the two virtual lines (L2) interposed between the first divided area (D1) and the second divided area (D2), a third divided area (D3) adjacent to the second divided area (D2) with the other of the two virtual lines (L1) interposed between the second divided area (D2) and the third divided area (D3), and a fourth divided area (D4) adjacent to both the third divided area (D3) and the first divided area (D1) be provided as the divided areas, and the disposition of the drive terminals (14D) be point-symmetric with respect to the center (O) of the lower face (10b) between the first divided area (D1) and the third divided area (D3), and the disposition of the drive terminals (14D) be point-symmetric with respect to the center (O) of the lower face (10b) between the second divided area (D2) and the fourth divided area (D4).

A second circuit board according to the disclosure preferably includes the following configurations.

A circuit board (1) that is formed to have a rectangular shape when viewed in plan, that is installed with a semiconductor module (3) on an upper face (10a), and that is provided with a plurality of connection terminals (14) on a lower face (10b), in which the connection terminals (14) include a pin terminal (14P) that is provided with a connection pin (16) that protrudes from the lower face (10b) and a pin-less terminal (14N) that is not provided with the connection pin (16), and the disposition of the pin terminal (14P) in each of divided areas is point-symmetric with respect to the center (O) of the lower face (10b), the divided areas being the lower face (10b) divided into four with two virtual lines (L1, L2) that pass through the middle of each side of the lower face (10b) and that intersect at the center (O) of the lower face (10b).

With such a configuration, the circuit board (1) is less likely to be tilted when the circuit board (1) is connected to another circuit board such as a system circuit board, even if some of the connection terminals (14) are the pin-less terminals (14N), since the disposition of the pin terminals (14P) in each of the four divided areas (D1 to D4) is point-symmetric with respect to the center (O) of the lower face (10b). It is thus possible to realize the circuit board (1) that is less likely to be tilted when the circuit board is connected to another circuit board.

In the second circuit board of the configuration described above, it is preferable that a first divided area (D1), a second divided area (D2) adjacent to the first divided area (D1) with one of the two virtual lines (L2) interposed between the first divided area (D1) and the second divided area (D2), a third divided area (D3) adjacent to the second divided area (D2) with the other of the two virtual lines (L1) interposed between the second divided area (D2) and the third divided area (D3), and a fourth divided area (D4) adjacent to both the third divided area (D3) and the first divided area (D1) be provided as the divided areas, and the disposition of the pin terminals (14P) be point-symmetric with respect to the center (O) of the lower face (10b) between the first divided area (D1) and the third divided area (D3), and the disposition of the pin terminal (14P) be point-symmetric with respect to the center (O) of the lower face (10b) between the second divided area (D2) and the fourth divided area (D4).

A third circuit board according to the disclosure preferably includes the following configurations.

A circuit board (1) that is formed to have a rectangular shape when viewed in plan, that is installed with a semiconductor module (3) on an upper face (10a), and that is provided with a plurality of connection terminals (14) on a lower face (10b), in which the connection terminals (14) include a pin terminal (14P) that is provided with a connection pin (16) that protrudes from the lower face (10b) and a pin-less terminal (14N) that is not provided with the connection pin (16), the connection terminal (14) adjacent to the pin-less terminal (14N) is the pin terminal (14P), and the pin terminal (14P) is disposed at a position closest to a corner (C1 to C4) of the lower face (10b).

With such a configuration, the entire circuit board (1) is generally uniformly supported by the connection pins (16), since the pin-less terminals (14N) are disposed so as to be dispersed without being adjacent to each other and grouping together and the pin-less terminals (14N) are at least disposed at four points that at the outermost positions of the rectangular circuit board (1). The circuit board (1) is thus less likely to be tilted when the circuit board (1) is connected to another circuit board such as a system circuit board, even when the some of the connection terminals (14) are pin-less terminals (14N). It is thus possible to realize the circuit board (1) that is less likely to be tilted when the circuit board is connected to another circuit board. It is also possible to suppress the circuit board (1) from being warped when the circuit board (1) is heated.

As one aspect, it is preferable that the disposition of the pin terminal (14P) in each of divided areas be point-symmetric with respect to the center (O) of the lower face (10b), the divided areas being the lower face (10b) divided into four with two virtual lines (L1, L2) that pass through the middle of each side of the lower face (10b) and that intersect at the center (O) of the lower face (10b).

With such a configuration, the entire circuit board (1) is generally uniformly supported by the connection pins (16), since the disposition of the pin terminals (14P) in each of the four divided areas (D1 to D4) is point-symmetric with respect to the center (O) of the lower face (10b). It is thus possible to effectively suppress the circuit board (1) from being tilted when the circuit board (1) is connected to another circuit board.

Specifically, it is preferable that a first divided area (D1), a second divided area (D2) adjacent to the first divided area (D1) with one of the two virtual lines (L2) interposed between the first divided area (D1) and the second divided area (D2), a third divided area (D3) adjacent to the second divided area (D2) with the other of the two virtual lines (L1) interposed between the second divided area (D2) and the third divided area (D3), and a fourth divided area (D4) adjacent to both the third divided area (D3) and the first divided area (D1) be provided as the divided areas, and the disposition of the pin terminals (14P) be point-symmetric with respect to the center (O) of the lower face (10b) between the first divided area (D1) and the third divided area (D3), and the disposition of the pin terminal (14P) be point-symmetric with respect to the center (O) of the lower face (10b) between the second divided area (D2) and the fourth divided area (D4).

As one aspect, it is preferable that the connection terminals (14) be disposed along each side (S1 to S4) of the lower face (10b) so as to form a plurality of terminal arrays (14R) from an outer edge of the lower face (10b), and the pin terminals (14P) be disposed over the terminal arrays (14R) in a corner portion area (Rc1 to Rc4) including a corner (C1 to C4) of the lower face (10b).

With such a configuration, the circuit board (1) is supported by the connection pin (16) at a larger area of the four corners of the rectangular circuit board (1). It is thus possible to effectively suppress the circuit board (1) from being tilted when the circuit board (1) is connected to another circuit board.

As one aspect, it is preferable that the pin terminals (14P) be disposed so as to be arranged along each side (S1 to S4) of the lower face (10b).

With such a configuration, the circuit board (1) is supported by the connection pin (16) along each of the four sides of the rectangular circuit board (1). It is thus possible to effectively suppress the circuit board (1) from being tilted when the circuit board (1) is connected to another circuit board and suppress the circuit board (1) from being warped when the circuit board (1) is heated.

The designing method of the circuit board according to the disclosure preferably includes the following configurations.

A designing method of a circuit board (1) that is formed to have a rectangular shape when viewed in plan, that is installed with a semiconductor module (3) on an upper face (10a), that is provided with a plurality of connection terminals (14) on a lower face (10b), and that is provided with a connection pin (16) protruding from the lower face (10b) on at least some connection terminals (14), the designing method including: sorting the connection terminals (14) into a drive terminal (14D) for driving the semiconductor module (3) and a function terminal (14F) for connecting the semiconductor module (3) and other function units; and disposing the drive terminal (14D) and the function terminal (14F) so that the disposition of the drive terminal (14D) in each of divided areas is point-symmetric with respect to the center (O) of the lower face (10b), the divided areas being the lower face (10b) divided into four with two virtual lines (L1, L2) that pass through the middle of each side of the lower face (10b) and that intersect at the center (O) of the lower face (10b).

The circuit board (1) that is produced based on the designing method is less likely to be tilted when the circuit board (1) is connected to another circuit board such as a system circuit board, even if the connection pin (16) is not provided on some function terminals (14F), since the disposition of the drive terminals (14D) in each of the four divided areas (D1 to D4) is point-symmetric with respect to the center (O) of the lower face (10b). It is thus possible to produce the circuit board (1) that is less likely to be tilted when the circuit board (1) is connected to another circuit board even when there is an unused terminal in a part of the circuit board.

In the designing method of the circuit board described above, it is preferable that a first divided area (D1), a second divided area (D2) adjacent to the first divided area (D1) with one of the two virtual lines (L2) interposed between the first divided area (D1) and the second divided area (D2), a third divided area (D3) adjacent to the second divided area (D2) with the other of the two virtual lines (L1) interposed between the second divided area (D2) and the third divided area (D3), and a fourth divided area (D4) adjacent to both the third divided area (D3) and the first divided area (D1) be provided as the divided areas, and the disposition of the drive terminals (14D) be point-symmetric with respect to the center (O) of the lower face (10b) between the first divided area (D1) and the third divided area (D3), and the disposition of the drive terminals (14D) be point-symmetric with respect to the center (O) of the lower face (10b) between the second divided area (D2) and the fourth divided area (D4).

A semiconductor device according to the disclosure preferably includes the following configurations.

A semiconductor device (100) according to the disclosure includes: a circuit board (1) that is formed to have a rectangular shape when viewed in plan, that is installed with a semiconductor module (3) on an upper face, and that is provided with a plurality of connection terminals (14) on a lower face (10b); and a main circuit board (90) on which the circuit board (1) is surface-mounted via the connection terminals (14), in which a power source unit (81), a clock unit (82), and a reset unit (83) are disposed on the main circuit board (90), circuit board terminals (91a, 91b) that are each connected to a corresponding one of an audio function unit (71) and a camera function unit (72) are provided on the main circuit board (90), a connection pin (16) protruding from the lower face (10b) is provided on at least some connection terminals (14), the connection terminals (14) include a drive terminal (14D) for connecting the semiconductor module (3) with the power source unit (81), the clock unit (82), and the reset unit (83), and a function terminal (14F) for connecting the semiconductor module (3) and the circuit board terminals (91a, 91b), and in the circuit board (1), the disposition of the drive terminal (14D) in each of divided areas is point-symmetric with respect to the center (O) of the lower face (10b), the divided areas being the lower face (10b) divided into four with two virtual lines (L1, L2) that pass through the middle of each side of the lower face (10b) and that intersect at the center (O) of the lower face (10b).

With such a configuration, the circuit board (1) is less likely to be tilted when the circuit board (1) and the main circuit board (90) are connected, even when the connection pin (16) is not provided for the function terminal (14F) corresponding to the unnecessary function unit if either the audio function unit (71) or the camera function unit (72) is unnecessary, since the disposition of the drive terminals (14D) in each of the four divided areas (D1 to D4) is point-symmetric with respect to the center (O) of the lower face (10b). It is thus possible to keep the generation rate of a defective product low and decrease manufacturing costs, and increase reliability of the semiconductor device (100).

In the semiconductor device described above, it is preferable that a first divided area (D1), a second divided area (D2) adjacent to the first divided area (D1) with one of the two virtual lines (L2) interposed between the first divided area (D1) and the second divided area (D2), a third divided area (D3) adjacent to the second divided area (D2) with the other of the two virtual lines (L1) interposed between the second divided area (D2) and the third divided area (D3), and a fourth divided area (D4) adjacent to both the third divided area (D3) and the first divided area (D1) be provided as the divided areas, and in the circuit board (1), the disposition of the drive terminal (14D) be point-symmetric with respect to the center (O) of the lower face (10b) between the first divided area (D1) and the third divided area (D3), and the disposition of the drive terminal (14D) be point-symmetric with respect to the center (O) of the lower face (10b) between the second divided area (D2) and the fourth divided area (D4).

The circuit board and the designing method according to the disclosure only need to be able to accomplish at least one of the effects described above.

The invention claimed is:

1. A circuit board having a rectangular shape when viewed in plan, the circuit board comprising:
   a semiconductor module on an upper face of the circuit board;
   a plurality of connection terminals on a lower face of the circuit board, the connection terminals including:
      a plurality of drive terminals for driving the semiconductor module;
      a plurality of first function terminals connected via a first electrode pattern to a first function unit that is connected to the semiconductor module; and
      a plurality of second function terminals connected via a second electrode pattern to a second function unit that is connected to the semiconductor module; and
   a plurality of connection pins protruding from the lower face that are on at least some of the connection terminals,
   wherein a disposition of the drive terminals in each of divided areas is point-symmetric with respect to a center of the lower face, the divided areas being the lower face divided into four with two virtual lines that pass through a middle of each side of the lower face and that intersect at the center of the lower face, and the plurality of first function terminals and the plurality of second function terminals are disposed alternately in a function terminal disposition area of the lower face.

2. The circuit board according to claim 1, wherein the drive terminals are disposed at positions closest to corners of the lower face.

3. The circuit board according to claim 1, wherein
the connection terminals are disposed along each side of the lower face so as to form a plurality of terminal arrays from an outer edge of the lower face, and
the drive terminals are disposed over the terminal arrays in corner portion areas including corners of the lower face.

4. The circuit board according to claim 1, wherein the drive terminals are disposed along each side of the lower face.

5. The circuit board according to claim 1, wherein
the connection terminals are disposed along each side of the lower face so as to form a plurality of terminal arrays from an outer edge of the lower face,
the plurality of first function terminals corresponds to a first function executed by the semiconductor module,
the plurality of second function terminals corresponds to a second function executed by the semiconductor module, and
the plurality of first function terminals and the plurality of second function terminals are disposed alternately, in each of the terminal arrays.

6. The circuit board according to claim 1, wherein
a first divided area, a second divided area adjacent to the first divided area with one of the two virtual lines interposed between the first divided area and the second divided area, a third divided area adjacent to the second divided area with the other of the two virtual lines interposed between the second divided area and the third divided area, and a fourth divided area adjacent to both the third divided area and the first divided area are provided as the divided areas, and
the disposition of the drive terminals is point-symmetric with respect to the center of the lower face between the first divided area and the third divided area, and the disposition of the drive terminals is point-symmetric with respect to the center of the lower face between the second divided area and the fourth divided area.

7. The circuit board according to claim 1, wherein the connection terminals include:
a plurality of pin terminals that are provided with the plurality of connection pins; and
a plurality of pin-less terminals that are not provided with the connection pins;
wherein:
the pin terminals are adjacent to pin-less terminals; and
the pin terminals are disposed at positions closest to corners of the lower face.

8. The circuit board according to claim 5, wherein the drive terminals are disposed adjacently to at least one of the plurality of first function terminals and the plurality of second function terminals in a direction orthogonal to each side of the lower face.

9. The circuit board according to claim 7, wherein a disposition of the pin terminals in each of the divided areas is point-symmetric with respect to the center of the lower face.

10. The circuit board according to claim 7, wherein
the connection terminals are disposed along each side of the lower face so as to form a plurality of terminal arrays from an outer edge of the lower face, and
the pin terminals are disposed over the terminal arrays in corner portions areas including corners of the lower face.

11. The circuit board according to claim 7, wherein the pin terminals are disposed along each side of the lower face.

12. The circuit board according to claim 9, wherein
a first divided area, a second divided area adjacent to the first divided area with one of the two virtual lines interposed between the first divided area and the second divided area, a third divided area adjacent to the second divided area with the other of the two virtual lines interposed between the second divided area and the third divided area, and a fourth divided area adjacent to both the third divided area and the first divided area are provided as the divided areas, and
the disposition of the pin terminals is point-symmetric with respect to the center of the lower face between the first divided area and the third divided area, and the disposition of the pin terminals is point-symmetric with respect to the center of the lower face between the second divided area and the fourth divided area.

13. A designing method of a circuit board that has a rectangular shape when viewed in plan and a semiconductor module on an upper face, that is provided with a plurality of connection terminals on a lower face, and that is provided with a plurality of connection pins protruding from the lower face on at least some connection terminals, the designing method including:
sorting the connection terminals into a plurality of drive terminals for driving the semiconductor module, a plurality of first function terminals for connecting a first function unit to the semiconductor module via a first electrode pattern, and a plurality of second function terminals for connecting a second function unit to the semiconductor module via a second electrode pattern;
disposing the drive terminals, the first function terminals, and the second function terminals so that the drive terminals are disposed in each of divided areas point-symmetrically with respect to a center of the lower face, the divided areas being the lower face divided into four with two virtual lines that pass through a middle of each side of the lower face and that intersect at the center of the lower face; and
disposing the plurality of first function terminals and the plurality of second function terminals alternately in a function terminal disposition area of the lower face.

* * * * *